(12) United States Patent
Yoshikawa et al.

(10) Patent No.: US 7,957,184 B2
(45) Date of Patent: Jun. 7, 2011

(54) MAGNETORESISTIVE ELEMENT AND MAGNETORESISTIVE RANDOM ACCESS MEMORY INCLUDING THE SAME

(75) Inventors: Masatoshi Yoshikawa, Yokohama (JP); Eiji Kitagawa, Sagamihara (JP); Tadaomi Daibou, Kawasaki (JP); Toshihiko Nagase, Sagamihara (JP); Tatsuya Kishi, Yokohama (JP); Hiroaki Yoda, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/790,171

(22) Filed: May 28, 2010

(65) Prior Publication Data
US 2010/0230770 A1   Sep. 16, 2010

Related U.S. Application Data

(63) Continuation of application No. 12/211,388, filed on Sep. 16, 2008, now Pat. No. 7,768,824.

(30) Foreign Application Priority Data

Sep. 25, 2007   (JP) ................................. 2007-248251

(51) Int. Cl.
*G11C 11/15* (2006.01)
*G11C 11/00* (2006.01)
(52) U.S. Cl. ......... 365/173; 365/158; 365/171; 257/421
(58) Field of Classification Search ................... 365/173
See application file for complete search history.

(56) References Cited

U.S. PATENT DOCUMENTS

| 5,650,958 | A | 7/1997 | Gallagher et al. |
| 6,256,223 | B1 | 7/2001 | Sun |
| 6,650,513 | B2 | 11/2003 | Fullerton et al. |
| 6,727,105 | B1 | 4/2004 | Brug et al. |
| 6,885,049 | B2 | 4/2005 | Nickel |
| 7,663,131 | B2 | 2/2010 | Horng et al. |
| 2005/0270704 | A1 * | 12/2005 | Suzuki et al. ............ 360/324.11 |
| 2008/0180859 | A1 | 7/2008 | Ueda et al. |
| 2008/0291585 | A1 | 11/2008 | Yoshikawa et al. |
| 2009/0080124 | A1 * | 3/2009 | Yoshikawa et al. ...... 360/324.12 |
| 2009/0251951 | A1 * | 10/2009 | Yoshikawa et al. ........... 365/158 |

FOREIGN PATENT DOCUMENTS

JP    2005-50907    2/2005

(Continued)

OTHER PUBLICATIONS

J.C. Slonczewski, "Current-driven excitation of magnetic multilayers", Journal of Magnetism and Magnetic Materials, 159, 1996, pp. L1-L7.

(Continued)

*Primary Examiner* — Son L Mai
(74) *Attorney, Agent, or Firm* — Oblon, Spivak, McClelland, Maier & Neustadt, L.L.P.

(57) ABSTRACT

The present invention provides a low-resistance magnetoresistive element of a spin-injection write type. A crystallization promoting layer that promotes crystallization is formed in contact with an interfacial magnetic layer having an amorphous structure, so that crystallization is promoted from the side of a tunnel barrier layer, and the interface between the tunnel barrier layer and the interfacial magnetic layer is adjusted. With this arrangement, it is possible to form a magnetoresistive element that has a low resistance so as to obtain a desired current value, and has a high TMR ratio.

33 Claims, 11 Drawing Sheets

FOREIGN PATENT DOCUMENTS

| | | |
|---|---|---|
| JP | 2006-80385 | 3/2006 |
| JP | 2007-59879 | 3/2007 |
| JP | 2007-150265 | 6/2007 |
| JP | 2007-157840 | 6/2007 |
| JP | 2007-525033 | 8/2007 |
| WO | WO 2005/083714 A1 | 9/2005 |

OTHER PUBLICATIONS

Office Action issued Nov. 9, 2010 in JP Application No. 2007-248251 (With English Translation).

Office Action mailed Mar. 26, 2010 in JP Patent Application No. 2007-248251 with English Translation.

* cited by examiner

MAGNETORESISTIVE ELEMENT AND MAGNETORESISTIVE RANDOM ACCESS MEMORY INCLUDING THE SAME

CROSS-REFERENCE TO RELATED APPLICATION

This application is a continuation of U.S. Ser. No. 12/211,388, filed Sep. 16, 2008, which claims priority under U.S.C. 119 to Japanese Application No. 2007-248251, filed Sep. 25, 2007, the entire contents of both of which are incorporated herein by reference.

BACKGROUND OF THE INVENTION

1. Field of the Invention

The present invention relates to a magnetoresistive element and a magnetoresistive random access memory including the magnetoresistive element.

2. Related Art

In recent years, a number of solid-state memories that record information have been suggested on the basis of novel principles. Among those solid-state memories, magnetoresistive random access memories (hereinafter also referred to as MRAMs) that take advantage of tunneling magneto resistance (hereinafter also referred to as TMR) have been known as solid-state magnetic memories. Each MRAM includes magnetoresistive elements (hereinafter also referred to as MR elements) that exhibit magnetoresistive effects as the memory elements of memory cells, and the memory cells store information in accordance with the magnetization states of the MR elements.

Each MR element includes a magnetization free layer having a magnetization where a magnetization direction is variable, and a magnetization reference layer having a magnetization of which a direction is invariable. When the magnetization direction of the magnetization free layer is parallel to the magnetization direction of the magnetization reference layer, the MR element is put into a low resistance state. When the magnetization direction of the magnetization free layer is antiparallel to the magnetization direction of the magnetization reference layer, the MR element is put into a high resistance state. The difference in resistance is used in storing information.

As a method of writing information on such a MR element, a so-called current-field write method has been known. By this method, a line is placed in the vicinity of the MR element, and the magnetization of the magnetization free layer of the MR element is reversed by the magnetic field generated by the current flowing through the line. When the size of the MR element is reduced to form a small-sized MRAM, the coercive force Hc of the magnetization free layer of the MR element becomes larger. Therefore, in a MRAM of the current-field write type, the current required for writing tends to be larger, since the MRAM is small-sized. As a result, it is difficult to use a low current and small-sized memory cells designed to have capacity larger than 256 Mbits.

As a write method designed to overcome the above problem, a write method that utilizes spin momentum transfers (SMT) (a spin-injection writing method or spin-transfer-torque writing method) has been suggested (see U.S. Pat. No. 6,256,223). By the spin-injection write method, a current is applied in a direction perpendicular to the film plane of each of the films forming a MR element having a tunneling magnetoresistive effect, so as to change (reverse) the magnetization state of the MR element.

In a magnetization reversal caused by spin injection, the current Ic required for the magnetization reversal is determined by the current density Jc. Accordingly, as the area of the face on which the current flows becomes smaller in a MR element, the injection current Ic required for reversing the magnetization becomes smaller. In a case where writing is performed with fixed current density, the current Ic becomes smaller, as the size of the MR element becomes smaller. Accordingly, the spin-injection writing method provides excellent scalability in principle, compared with the current-induced magnetic field writing method.

In a MRAM of a spin injection type, however, the current that can be applied at the time of writing is determined by the voltage generated at a selective transistor and the relationship in resistance between the selective transistor and each TMR element. Therefore, it is necessary to lower the resistance of each TMR element, or to lower the resistance of each TMR film.

SUMMARY OF THE INVENTION

The present invention has been made in view of these circumstances, and an object thereof is to provide a magnetoresistive element of a low-resistance spin-injection writing type that allows the magnetization free layer to have a magnetization reversal with a low current, and a magnetoresistive random access memory that includes the magnetoresistive element.

A magnetoresistive element according to a first aspect of the present invention includes: a magnetization reference layer having magnetization perpendicular to a film plane, a direction of the magnetization being invariable in one direction; a magnetization free layer having magnetization perpendicular to the film plane, a direction of the magnetization being variable; and an intermediate layer provided between the magnetization reference layer and the magnetization free layer, at least one of the magnetization reference layer and the magnetization free layer including: an interfacial magnetic layer formed in contact with the intermediate layer, and having a crystalline phase crystallized from an amorphous structure; and a crystallization promoting layer formed in contact with the interfacial magnetic layer on the opposite side from the intermediate layer, and promoting crystallization of the interfacial magnetic layer, the magnetization direction of the magnetization free layer being variable by flowing a current between the magnetization reference layer and the magnetization free layer via the intermediate layer.

A magnetoresistive element according to a second aspect of the present invention includes: a magnetization reference layer having magnetization parallel to a film plane, a direction of the magnetization being invariable in one direction; a magnetization free layer having magnetization parallel to the film plane, a direction of the magnetization being variable; and an intermediate layer provided between the magnetization reference layer and the magnetization free layer, at least one of the magnetization reference layer and the magnetization free layer including: an interfacial magnetic layer formed in contact with the intermediate layer, and having a crystalline phase crystallized from an amorphous structure; and a crystallization promoting layer formed in contact with the interfacial magnetic layer on the opposite side from the intermediate layer, and promoting crystallization of the interfacial magnetic layer, the magnetization direction of the magnetization free layer being variable by flowing a current between the magnetization reference layer and the magnetization free layer via the intermediate layer.

A magnetoresistive random access memory according to a third aspect of the present invention includes: the magnetoresistive element according to any one of the first and second aspects as a memory cell.

A magnetoresistive random access memory according to a fourth aspect of the present invention includes: a memory cell that includes the magnetoresistive element according to any one of the first and second aspects, and a transistor having one end series-connected to one end of the magnetoresistive element; a first write current circuit connected to the other end of the magnetoresistive element; and a second write current circuit connected to the other end of the transistor, and, in cooperation with the first write current circuit, flowing the current between the magnetization reference layer and the magnetization free layer via the intermediate layer.

DESCRIPTION OF THE EMBODIMENTS

Figure 1:
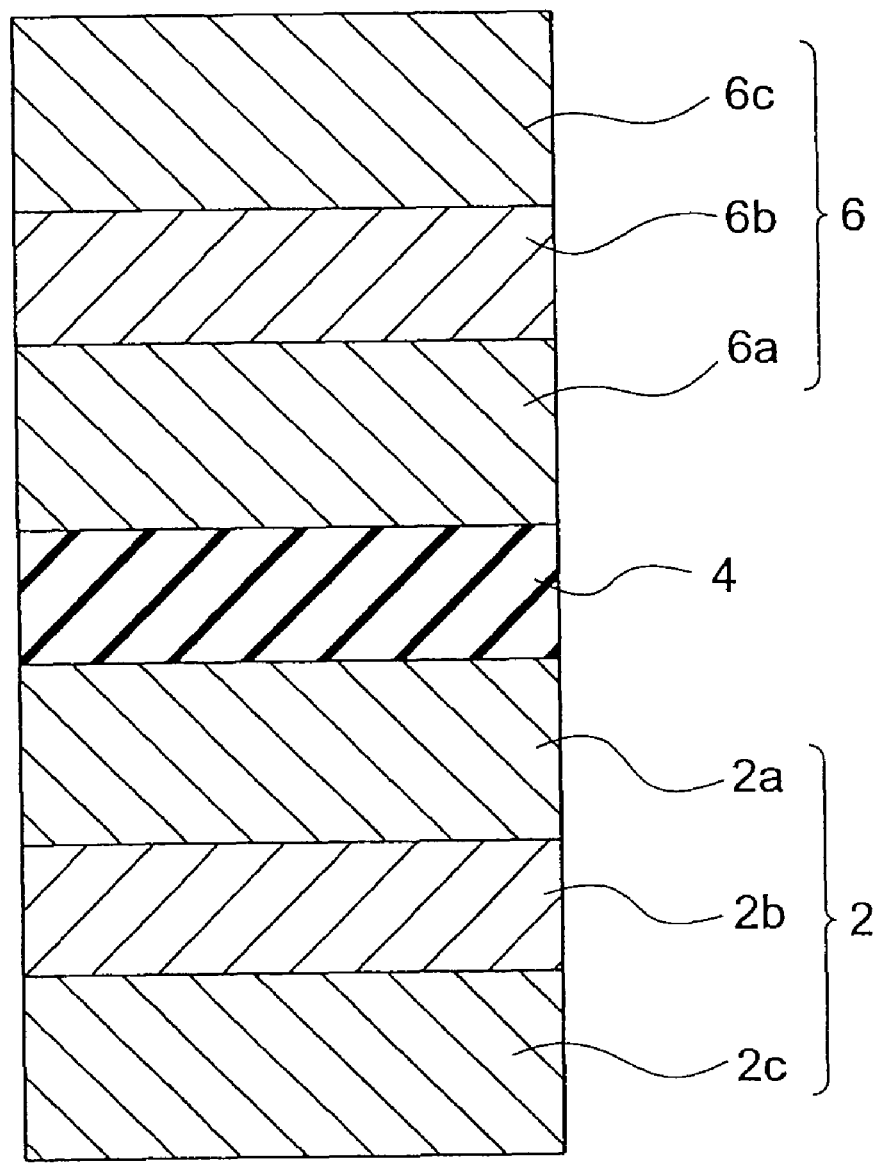
FIG. 1 is a cross-sectional view of a TMR element in accordance with a first embodiment of the present invention.

The following is a description of embodiments of the present invention, with reference to the accompanying drawings. In the following description, like components having like functions and structures are denoted by like reference numerals, and explanation is repeated only where necessary.

First Embodiment

FIG. 1 shows a magnetoresistive element (hereinafter also referred to as a TMR element) in accordance with a first embodiment of the present invention. The TMR element 1 of this embodiment includes: a magnetization reference layer 2 that includes a magnetic film having a magnetization of which a direction is invariable in one direction; a magnetization free layer 6 that includes a magnetic film having a magnetization of which a direction is variable; and an intermediate layer 4 that is provided between the magnetization reference layer 2 and the magnetization free layer 6.

In general, a TMR element is an element that is designed to be in one of two steady states in accordance with the direction of the bidirectional current flowing in a direction perpendicular to the film plane. The two steady states are associated with "0" date and "1" data, respectively, so that the TMR element can store binary data. This is called the spin-injection writing type (or spin-transfer-torque writing type), by which the magnetization is varied with the direction of the current flowing direction, and information corresponding to the magnetization state is stored. When there is the "0" data, the magnetization directions of the magnetization free layer 6 and the magnetization reference layer 2 are in a parallel state. When there is the "1" data, the magnetization directions are in an antiparallel state. The magnetization directions of the magnetization free layer 6 and the magnetization reference layer 2 are substantially parallel to the film plane, or are substantially perpendicular to the film plane. The magnetization substantially parallel to the film plane will be hereinafter also referred to as the in-plane magnetization, and the magnetization substantially perpendicular to the film plane will be hereinafter also referred to as the perpendicular magnetization.

In this embodiment, the magnetization reference layer 2 includes an interfacial magnetic layer 2a, a crystallization promoting layer 2b, and an assisting magnetic film 2c. The interfacial magnetic layer 2a is provided on the opposite side of the intermediate layer 4 from the magnetization free layer 6. The assisting magnetic film 2c is provided on the opposite side of the interfacial magnetic layer 2a from the intermediate layer 4. The crystallization promoting layer 2b is provided between the interfacial magnetic layer 2a and the assisting magnetic film 2c.

Also, the magnetization free layer 6 includes an interfacial magnetic layer 6a, a crystallization promoting layer 6b, and an assisting magnetic film 6c. The interfacial magnetic layer 6a is provided on the opposite side of the intermediate layer 4 from the magnetization reference layer 2. The assisting magnetic layer 6c is provided on the opposite side of the interfacial magnetic layer 6a from the intermediate layer 4. The crystallization promoting layer 6b is provided between the interfacial magnetic layer 6a and the assisting magnetic layer 6c.

(First Modification)

Figure 2:
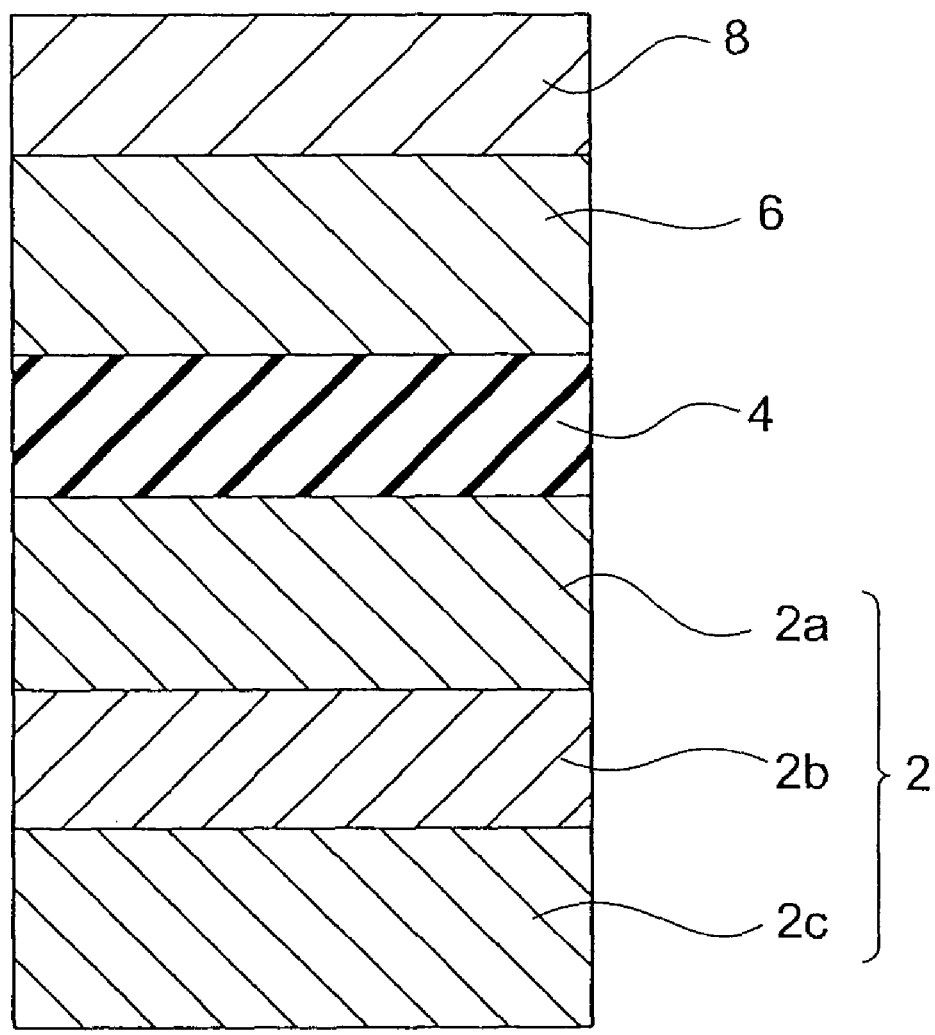
FIG. 2 is a cross-sectional view of a TMR element in accordance with a first modification of the first embodiment.

FIG. 2 shows a TMR element in accordance with a first modification of this embodiment. The TMR element 1A of the first modification differs from the TMR element 1 of the first embodiment shown in FIG. 1 in that the magnetization free layer 6 is a single-layer interfacial magnetic layer without the crystallization promoting layer 6b and the assisting magnetic layer 6c, and a crystallization promoting layer 8 is provided on the opposite side of the magnetization free layer 6 from the intermediate layer 4.

(Second Modification)

Figure 3:
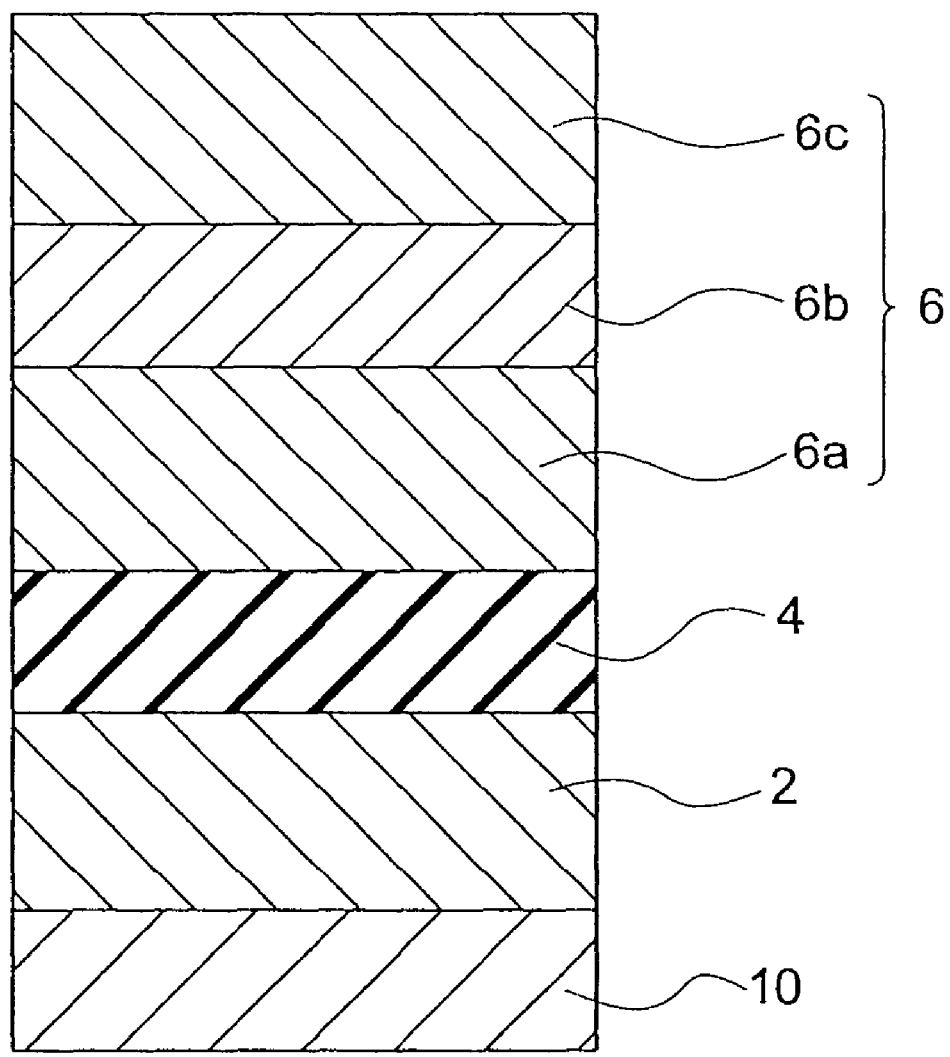
FIG. 3 is a cross-sectional view of a TMR element in accordance with a second modification of the first embodiment.

FIG. 3 shows a TMR element in accordance with a second modification of this embodiment. The TMR element 1B of the second modification differs from the TMR element 1 of the first embodiment shown in FIG. 1 in that the magnetization reference layer 2 is a single-layer interfacial magnetic layer without the crystallization promoting layer 2b and the assisting magnetic layer 2c, and a crystallization promoting layer 10 is provided on the opposite side of the magnetization reference layer 2 from the intermediate layer 4.

(Third Modification)

Figure 4:
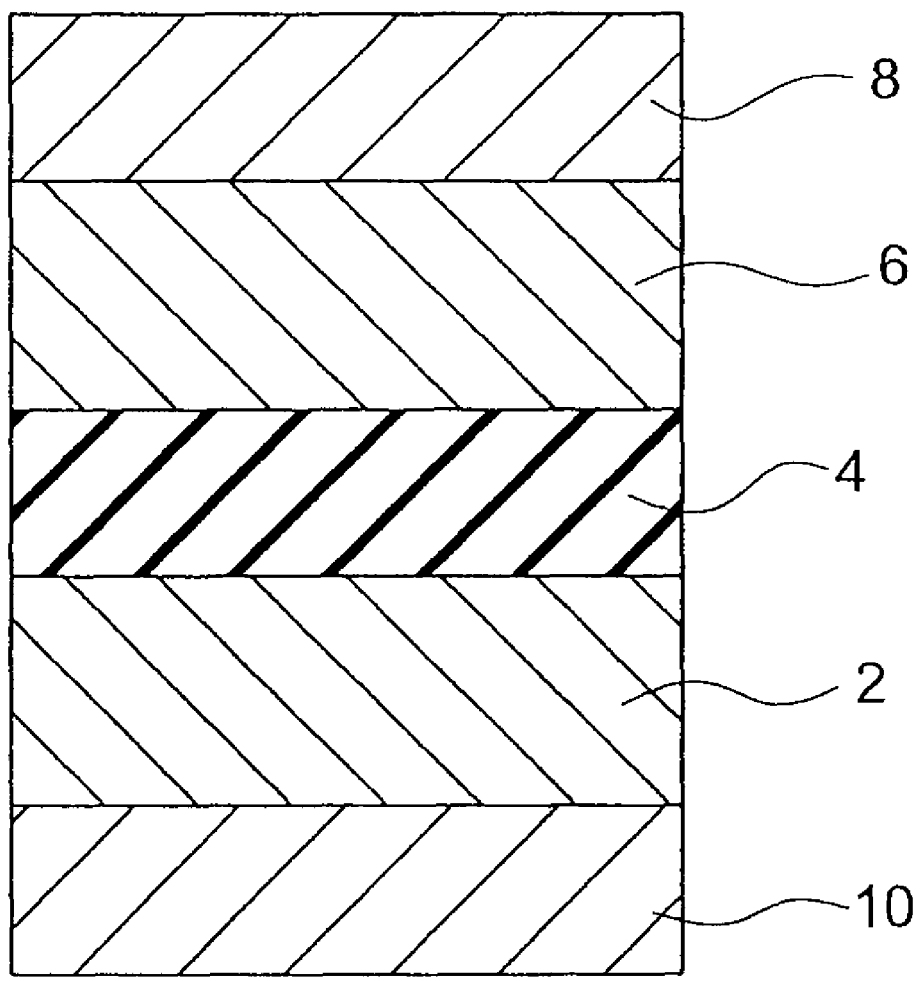
FIG. 4 is a cross-sectional view of a TMR element in accordance with a fourth modification of the first embodiment.

FIG. 4 shows a TMR element in accordance with a third modification of this embodiment. The TMR element 1C of the third modification differs from the TMR element 1A of the first modification shown in FIG. 2 in that the magnetization reference layer 2 is a single-layer interfacial magnetic layer without the crystallization promoting layer 2b and the assisting magnetic layer 2c, and a crystallization promoting layer 10 is provided on the opposite side of the magnetization reference layer 2 from the intermediate layer 4.

As described above, in each of the TMR elements in accordance with this embodiment and its modifications, a stacked structure formed with an intermediate layer, an interfacial magnetic layer, and a crystallization promoting layer (a crystallization promoting layer) is provided at both sides of the intermediate layer 4. However, the stacked structure may be provided only on one side of the intermediate layer 4.

Further, in this embodiment, the first modification, and the second modification, either the magnetization reference layer 2 or the magnetization free layer 6 has an assisting magnetic layer. This assisting magnetic layer is designed to generate anisotropy energy, when assisting the perpendicular magnetization of either the magnetization reference layer 2 or the magnetization free layer 6, or increasing the resistance to thermal disturbance.

In this embodiment and its modifications, the crystallization promoting layers 8 and 10 and the crystallization promoting layers 2b and 6b have an "effect of facilitating crystallization of an interfacial magnetic layer". When crystallization of an interfacial magnetic layer is started from the interface with the intermediate layer 4, the lattice mismatching at the interface is smaller, and lower resistance and a higher TMR ratio can be expected. As incidental effects, unnecessary oxygen is absorbed from the interfacial magnetic layer, and crystallization is facilitated.

In a case where a tunnel barrier layer made of an insulating oxide material (hereinafter also referred to as the barrier layer) is used as the intermediate layer 4, the crystallization promoting layers and the crystallization promoting layers have the effect of absorbing excessive oxygen from the barrier layer to make the barrier layer similar to the stoichiometric composition and to prevent the barrier layer from being in a peroxidative state. This interfacial magnetic layer mainly has an amorphous structure immediately after its formation. Here, the "mainly" means that the amorphous structure occupies 50% or more area when observed in the film plane, or 50% or more of the volume in the film plane is the amorphous structure. An "amorphous structure" does not have long-range order like crystals, but has short-range order. Because of the crystalline structure, only the first-nearest atoms are defined. The number of the first-nearest atoms and the types of atoms can be analyzed by a technique such as the EXAFS (Extended X-ray Adsorption Fine Structure) technique. Also, the embodiment of the present invention contains a polycrystalline film having mean crystal grains of 2 nm or smaller in diameter. This is because chances are that the structure cannot be determined whether to be a crystalline structure or an amorphous structure. Although the interfacial magnetic layer in the embodiment of the present invention is an amorphous structure immediately after the film formation, the interfacial magnetic layer is characteristically crystallized from the amorphous structure by injecting excitation energy generated by carrying out heat treatment immediately after the film formation, generating Joule heat a current, or performing ion irradiation.

In this embodiment and its modifications, the intermediate layer 4 is a tunnel barrier layer (hereinafter also referred to as the barrier layer). The barrier layer is made of an oxide having a NaCl structure. Specific examples of the materials that can be used for the barrier layer include CaO, MgO, SrO, BaO, and TiO, which are oxides of Be, Ca, Mg, Sr, Ba, Ti, and the likes. Alternatively, the barrier layer may be made of a mixed crystal material of those oxides. With the easiness of formation and the processability of the barrier layer being taken into consideration, MgO is practical and exhibits the highest MR ratio.

If the above described barrier layer of a NaCl structure has an epitaxially matched interface formed on the (001) plane with respect to a $Fe_{1-x-y}Co_xNi_y$ ($0 \leq x \leq 1$, $0 \leq y \leq 1$, $0 \leq x+y \leq 1$) magnetic film having a BCC (body-centered cubic) structure, a high TMR ratio can be achieved. If a high TMR ratio is achieved, the following preferred relationships should be established between the (001) plane of the barrier layer and the (001) plane of the magnetic film of a BCC structure:

[001] direction of barrier layer//[110] direction of magnetic film of BCC structure (100) plane of barrier layer//(100) plane of magnetic film of BCC structure Here, the symbol "//" means "being parallel".

It is preferable that the lattice misfit at the interface is small, so as to maintain the above orientation and direction relationships.

Further, if good lattice matching is maintained at the interface, the bonding between the band structures of the magnetic film and the barrier layer is good in an electronic state, and coherent electronic tunneling occurs. Ideally, when coherent electron tunneling occurs, the resistance of the TMR element including the magnetization reference layer 2, the tunnel barrier layer 4, and the magnetization free layer 6 becomes lower, and a high TMR ratio can be expected. To cause coherent tunneling in such a case, lattice matching is required at both interfaces of the barrier layer of a NaCl structure.

In a case where the (100) plane of the barrier layer and the (110) plane of the magnetic film of a BCC structure form an interface, the product of resistance and area RA standardized by the area becomes 10 to 100 times higher than the RA observed in a case of an matched interface, due to an increase in interfacial lattice misfit dislocation. Here, R represents the resistance of the element, and A represents the area of the element.

In a case where the barrier layer of a NaCl structure is grown directly on the (100) plane of the above described magnetic film having a BCC structure, it is difficult to reduce deformation of the MgO lattice, and a misfit dislocation occurs to lower the TMR ratio. This is because mismatching is caused at the interface due to the misfit dislocation at the interface.

For the reasons described above, it is very difficult to grow a barrier layer with a NaCl structure orientated to the (100) plane on the (100) plane of a magnetic film of a BCC structure. In such a case, other than the (100) plane, a mixed phase state in which the (111) plane is mixed with the (100) plane appears, and crystal grains orientated to the (100) plane and crystal grains orientated to the (111) plane exist at random. Accordingly, the energy increases caused by the interface misfit with the (100) plane of the magnetic film serving as the under layer can be reduced. Thus, the misfit dislocation due to the lattice misfit at the interface becomes larger, and the product of resistance and area RA of the TMR element becomes higher.

The barrier layer with a NaCl structure on the under layer having an amorphous structure, as described above, easily has crystal growth preferentially orientated to the (100) plane. If the interfacial magnetic layer in the embodiment of the present invention is to function as the under layer to form a barrier layer of a TMR element, an optimum material is an alloy formed by adding a half-metal element such as B, P, S, or C, or N (nitrogen), or a semiconductor element such as Si, Ge, or Ga to a $Fe_{1-x-y}Co_xNi_y$ ($0 \leq x \leq 1$, $0 \leq y \leq 1$, $0 \leq x+y \leq 1$) alloy inherently having a BCC structure. Each of those materials is crystallized through an excitation process such as heat treatment, and a BCC structure phase is then precipitated.

The optimum thickness of the interfacial magnetic layer is in the range of approximately 0.1 nm to 5 nm. If the thickness of the interfacial magnetic layer is smaller than 0.1 nm, a high TMR ratio and a low RA cannot be achieved. If the thickness exceeds 5 nm, the interfacial magnetic layer is much larger than the characteristic length with which a spin torque can be applied, and the magnetization free layer cannot have a magnetization reversal through spin injection. Therefore, the thickness of the interfacial magnetic layer is optimized so as to restrict the film thickness of the magnetization free layer to 5 nm or less.

The interfacial magnetic layer of the embodiment of the present invention should preferably contain at least one element selected from the group consisting of Fe, Co, and Ni at 50 atomic % or more. This is because, if the interfacial magnetic layer contains the element at less than 50 atomic %, magnetization might disappears. In such a case, there is a high probability that the polarizability of the interfacial magnetic layer also becomes lower and disappears. Even if the resistance can be lowered, a MR ratio cannot be measured.

To crystallize the above-mentioned amorphous phase, it is necessary to carry out heat treatment. When a BCC structure is precipitated through crystallization, it is necessary to prepare the origin of crystallization.

In this embodiment and its modifications, the interfacial magnetic layer having an amorphous structure stabilizes the entire energy through crystallization originated from the interface with the intermediate layer 4. More specifically, to achieve a high TMR ratio with a low current, it is necessary to facilitate crystallization of the interfacial magnetic layer having an amorphous structure, starting from the interface side of the tunnel barrier layer 4. In the case where crystallization starts from the side of the tunnel barrier layer 4, it is considered that the crystallization progresses by minimizing the misfit energy at the interface with the tunnel barrier layer while an appropriate amount of an additional material such as B, P, S, C, or N is contained. As a result, a very small amount of B, P, S, C, or N remains in the phase of the magnetic film of a BCC structure after recrystallization. Thus, the misfit dislocations at the interface can be restricted to a low amount.

In the above described interfacial magnetic layer, crystallization from an amorphous phase occurs first at the interface with lower interface energy. In this case, the crystallization structure and orientation after the crystallization are determined so that the interface energy of the interface at which the crystallization starts is reduced.

In this embodiment and its modifications, the interfacial magnetic layer having an amorphous structure is in contact with the barrier layer 4 of a NaCl structure on its (001) plane. Therefore, crystallization should ideally start at the interface on the side of the barrier layer 4 of a NaCl structure. In this case, the interfacial magnetic layer inevitably forms an interface epitaxially matching with the barrier layer 4 of a NaCl structure from an amorphous structure, and a BCC structure phase grows from this interface, orientated to the (001) plane. Here, the crystallization progresses while the following crystalline direction relationships (also described above) are maintained:

[001] direction of barrier layer//[110] direction of magnetic film of BCC structure (100) plane of barrier layer//(100) plane of magnetic film of BCC structure The inventors discovered what kind of layer should be brought into contact with the interface on the opposite side of the interfacial magnetic layer (crystallizing from an amorphous phase) from the barrier layer, so that the magnetic film having an amorphous structure is crystallized from the barrier layer side as described above. In other words, to facilitate crystallization from the barrier layer side, a layer made of a material that is crystallized at a lower speed is formed on the side of the other interface.

Here, the entire magnetic layer having an amorphous structure does not need to be crystallized, but the interface with the intermediate layer should be crystallized. The spin-injection magnetization reversal current might become lower in a case where only the interface with the intermediate layer (the barrier layer) and its neighboring area are crystallized.

More specifically, it is preferable to employ an element that forms a eutectic state with Fe, Co, and Ni, instead of a total solid-soluble state. It is more preferable to employ an element having a higher melting point than Fe, Co, and Ni. The melting points of Fe, Co, and Ni are 1540° C., 1490° C., and 1450° C., respectively.

As for the crystalline structure of the magnetic film, it is preferable to use an element having a BCC structure or a hexagonal closed pack (HCP) structure, other than a face-closed cubic (FCC) structure. Alternatively, it is preferable to use a covalent bonding element.

Next, materials that can be used for the crystallization promoting layers (or the crystallization promoting layers) in this embodiment and its modifications are described.

In each TMR element of this embodiment and its modifications, the crystallization promoting layer (or the crystallization promoting layer) is made of a rare earth element selected from the group consisting of Ce, Pr, Nd, Sm, Eu, Gd, Tb, Dy, Ho, Er, Tm, Yb, and Lu (hereinafter also referred to as the element A). Those rare earth elements have almost no solid solubility limits, when combined with Fe, Co, or Ni. Each magnetic film in the magnetization free layers and the magnetization reference layers of this embodiment and the first modification is made of an alloy containing an element selected from the group consisting of Fe, Co, and Ni, and is hardly solid soluble in a rare earth metal.

At the time of film formation by a sputtering technique or the like, the crystallization promoting layer (the crystallization promoting layer) causes mixing with the interfacial magnetic layer in an amorphous state at the interface, and partially forms an amorphous phase of Fe, Co, or Ni and a rare earth metal. The amorphous phase of Fe, Ni, or Co and a rare earth element has a high crystallization temperature. Accordingly, crystallization of the interfacial magnetic layer from an amorphous phase easily starts at the interface between the interfacial magnetic layer and the barrier layer.

Among rare earth elements, Gd is a ferromagnetic material having spontaneous magnetization. Accordingly, the exchange coupling between the interfacial magnetic layers 2a and 6a and the assisting magnetic layers 2c and 6c is not cut off by the addition of the crystallization promoting layers 2b and 6b. Also, in a case where Gd is employed, there are no upper limits set on the thicknesses of the crystallization promoting layers 2b and 6b, as long as they are in-plane magnetization films. The lower limit of the film thicknesses is 0.1 nm. If the crystallization promoting layers 2b and 6b are thinner than 0.1 nm, the insertion effect cannot be achieved. In a case where the magnetization free layer and the magnetization reference layer including the crystallization promoting layers have perpendicular magnetization, the thickness of the Gd layer should preferably be 2 nm or less, so as to maintain the perpendicular properties of the layer containing Gd.

Meanwhile, elements such as Ce, Pr, Nd, Sm, Eu, Tb, Dy, Ho, Er, Tm, Yb, and Lu do not have magnetism as single metals. However, each of those elements is alloyed with an element selected from the group consisting of Fe, Co, and Ni, and forms an amorphous structure or an intermetallic compound. In this manner, those elements come to have magnetism generated from the orbital moment. Likewise, Gd is alloyed with an element selected from the group consisting of Fe, Co, and Ni, and forms an amorphous structure or an intermetallic compound. In this manner, Gd comes to have magnetism generated from the orbital moment.

In a case where a high-energy film formation process involving a sputtering technique or the like is carried out on a single metal made of a rare metal element selected from the group consisting of Ce, Pr, Nd, Sm, Eu, Tb, Dy, Ho, Er, Tm, Yb, and Lu, an amorphous phase is formed when mixing with the magnetic film serving as the under layer is caused. Likewise, a mixing layer is formed on the rare-earth single-metal layer, and an amorphous phase is formed. Accordingly, the magnetic coupling or exchange coupling between the interfacial magnetic layers 2a and 6a and the assisting magnetic layers 2c and 6c is not cut off. In this case, the film thickness of each crystallization promoting layer should be 1 nm or less. This is because the mixing is caused approximately 0.5 nm above or below the crystallization promoting layer.

The crystallization promoting layer (the crystallization promoting layer) having magnetism and being exchange-coupled to the interfacial magnetic layer or the assisting magnetic layer is essential in a case where the magnetization reference layer and the magnetization free layer have perpendicular magnetization.

For example, in many cases, the magnetization reference layer 2 and the assisting magnetic layers 2c and 6c used in the magnetization free layer 6 have perpendicular magnetization, and the interfacial magnetic layers 2a and 6a have in-plane magnetic films, as shown in FIG. 1. To cause the interfacial magnetic layers 2a and 6a to have perpendicular magnetization in this case, it is necessary to maintain the exchange coupling between the crystallization promoting layers 2b and 6b and the interfacial magnetic layers 2a and 6a, and the exchange coupling between the crystallization promoting layers 2b and 6b and the crystallization promoting layers 2c and 6c.

When a rare earth element is alloyed with Co, Ni, or Fe (hereinafter also referred to as the element X), an amorphous structure is formed. The definition of an amorphous structure has already been described. An alloy of an amorphous structure formed with a rare earth element and the element X (Fe, Co, or Ni) can have perpendicular magnetization. An amorphous alloy formed with a rare earth element and the element X is a ferrimagnetic body. Accordingly, the amorphous alloy has the compensation point composition with which the net saturation magnetization Ms is zero. The compensation point composition is indicated by the atomic percentage (atomic %) of the rare earth element. If the amount of the rare earth element exceeds the compensation point composition, the saturation magnetization Ms takes a negative value. In other words, the field applying direction and the magnetization direction become opposite to each other. Since the saturation magnetization Ms becomes smaller when the composition is close to the compensation point, the effective magnetic crystalline anisotropy ($K_{u\text{-}effect}$) becomes larger, and stable perpendicular magnetization can be readily achieved. Accordingly, the above-described XA amorphous alloy is the optimum material for the crystallization promoting layer (the crystallization promoting layer) in a case of a MR element having perpendicular magnetization. Examples of amorphous structure alloys that have perpendicular magnetization and are formed with rare earth elements and the element A include a TbCoFe alloy, a GdCoFe alloy, and a TbGdCoFe alloy. It is also possible to add Ho or Dy to those alloys.

The crystallization promoting layer made of a rare earth element A selected from the group consisting of Ce, Pr, Nd, Sm, Eu, Gd, Tb, Dy, Ho, Er, Tm, Yb, and Lu should preferably remain an amorphous structure even after the interfacial magnetic layer is crystallized, except for the case where the element A is Gd. The film thickness of the crystallization promoting layer (the crystallization promoting layer) made of an amorphous alloy formed with a rare earth element and the element X is not limited, and should preferably be in the range of 0.1 nm to 10 nm.

In each TMR element of this embodiment and its modifications, the crystallization promoting layer (the crystallization promoting layer) may be made of an element selected from the group consisting of Mg, Ca, Sc, Ti, Sr, Y, Zr, Nb, Mo, Ba, La, Hf, Ta, and W (hereinafter referred to as the element B). Each of those elements has a BCC structure or a HCP structure. In a case where the element B is an element selected from the group consisting of Mg, Ca, Sc, Ti, Zr, Y, and Sr, a HCP structure is formed. In a case where the element B is an element selected from the group consisting of Ta, W, Nb, Mo, Ba, Hf, and La, a BCC structure is formed.

The above-described elements have almost no solid solubility limits with respect to Fe, Co, and Ni (hereinafter also referred to as the element X), and each of the elements can form an intermetallic compound. Each of those elements easily forms an amorphous structure phase, when alloyed. As will be described later in detail, those elements exhibit almost no solid solubility limits with a noble metal element (hereinafter referred to as the element Y) such as Pt, Pd, Au, Ag, Ru, Rh, Ir, or Os, or alloys.

The above-mentioned elements, Mg, Ca, Sc, Ti, Sr, Y, Zr, Nb, Mo, Ba, La, Hf, Ta, and W, are nonmagnetic elements. Therefore, the thickness of the crystallization promoting layer is restricted to 1 nm or less. If the thickness exceeds 1 nm, the exchange coupling between the interfacial magnetic layers 2a and 6a and the assisting magnetic layers 2c and 6c is cut off. The crystallization promoting layer (the crystallization promoting layers) that has a thickness of 1 nm or less and is made of an element (hereinafter referred to as the element B) selected from the group consisting of Mg, Ca, Sc, Ti, Sr, Y, Zr, Nb, Mo, Ba, La, Hf, Ta, and W causes mixing with the layer serving as the under layer, and forms an amorphous structure. Furthermore, the element B has a great effect of attracting oxygen atoms contained in the interfacial magnetic layers, because the element B has higher electronegativity than the element X such as Fe, Co, or Ni, and easily attracts oxygen. In each interfacial magnetic layer in this case, more oxygen is observed at locations closer to the crystallization promoting layer (the crystallization promoting layer). Accordingly, the oxygen concentration on the interface side of the barrier layer is lower, and crystallization from an amorphous structure is facilitated.

The crystallization promoting layer (the crystallization promoting layer) made of the element B may be crystallized to form a BCC structure or a HCP structure. In the case of a BCC structure, the orientation to the (100) plane is observed. In the case of a HCP structure, orientation does not matter.

In each TMR element of this embodiment and its modifications, the crystallization promoting layer may be made of an element (hereinafter also referred to as the element C) selected from the group consisting of Si, Ge, and Ga. Those elements are semiconductor elements having covalent bonding. The above-described elements have almost no solid solubility limits with respect to Fe, Ci, and Ni, and easily form amorphous structures when alloyed. As will be described later in detail, those elements have almost no solid solubility limits with respect to a noble metal element (the element Y) such as Pt, Pd, Au, Ag, Ru, Rh, Ir, or Os, or an alloy. Therefore, each assisting magnetic layer should preferably be an alloy or a stacked structure containing at least one element selected from the group consisting of Fe, Co, and Ni, and at least one element selected from the group consisting of Ru, Rh, Pd, Ag, Os, Ir, Pt, and Au.

The assisting magnetic layers used in the embodiment of the present invention are now described. Each of those assisting magnetic layers has the function of assisting and reinforcing the perpendicular magnetization characteristics of the magnetization reference layer or the magnetization free layer, and also has the function of improving the heat disturbance resistance of the magnetization reference layer or the magnetization free layer. These assisting magnetic layers are designed to provide magnetic crystalline anisotropy energy. Accordingly, in a case where the interfacial magnetic layer has sufficient perpendicular magnetization characteristics and heat disturbance resistance, it is not necessary to employ the assisting magnetic layers. The thickness of the assisting magnetic layer used in the magnetization free layer should be 5 nm or smaller, so that spin-injection magnetization reversals can be caused. A thickness of 5 nm or more is much larger than the characteristic length with which a spin torque is validly applied, and the magnetization free layer cannot have a magnetization reversal through spin injection if the assisting magnetic layer is thicker than 5 nm. The assisting magnetic layer used in the magnetization reference layer should have such a thickness as not to have a reversal when the magnetization free layer has a magnetization reversal. Therefore, the following relationship should be established:

$$M_{s\text{-}free} \cdot t_{free} < M_{s\text{-}reference} \cdot t_{reference}$$

where $M_{s\text{-}free}$, $M_{s\text{-}reference}$, $t_{free}$, and $t_{reference}$ represent the saturation magnetization of the magnetization free layer, the saturation magnetization of the magnetization reference layer, the film thickness of the magnetization free layer, and the film thickness of the magnetization reference layer, respectively.

The assisting magnetic layers having perpendicular magnetization are now described. Here, "perpendicular magnetization" and "magnetization substantially perpendicular to the film plane" are defined as the state in which the ratio (Mr/Ms) between the residual magnetization Mr and the saturation magnetization Ms when there is not a magnetic field is 0.5 or higher in the magnetization-field (M-H) curve obtained by carrying out VSM (vibration sample magnetization) measurement. The characteristic length with which a spin torque is validly applied is approximately 1.0 nm. Examples of the materials that exhibit perpendicular magnetization include a CoPt alloy, a CoCrPt alloy, and a CoCrPtTa alloy that have hexagonal closed pack (HCP) structures or face-centered cubic (FCC) structures. To exhibit magnetization perpendicular to the film plane, the material needs to be orientated to the (001) plane in a HCP structure, and needs to be orientated to the (111) plane in a FCC structure. A phase transition layer having a CsCl ordered structure phase tends to be orientated to the (110) plane.

The examples of the materials that exhibit perpendicular magnetization also include a RE-TM alloy that is formed with a rare earth metal (hereinafter also referred to as a RE) and an element selected from the group consisting of Co, Fe, and Ni (hereinafter also referred to as the TM element), and has an amorphous structure. The net saturation magnetization of the RE-TM alloy can be controlled to switch from a negative value to a positive value by adjusting the amount of the RE element. The point where the net saturation magnetization Ms-net becomes zero is called the compensation point, and the composition observed at that point is called the compensation point composition. In the compensation point composition, the proportion of the RE element falls in the range of 25 atomic % to 50 atomic %.

The examples of the materials that exhibit perpendicular magnetization also include an artificial-lattice perpendicular magnetization film formed with multilayer stacked layers: a magnetic layer containing an element selected from the group consisting of Co, Fe, and Ni; and a nonmagnetic metal layer containing Pd, Pt, Au, Rh, Ir, Os, Ru, Ag, or Cu. The material of the magnetic layer may be a $Co_{100-x-y}Fe_xNi_y$ alloy film ($0 \leq x \leq 100$, $0 \leq y \leq 100$). It is also possible to employ a CoFeNiB amorphous alloy having B added to the above CoFeNi alloy at 10 to 25 atomic %. The optimum film thickness of the magnetic layer is in the range of 0.1 nm to 1 nm. The optimum thickness of the nonmagnetic layer is in the range of 0.1 nm to 3 nm. The crystalline structure of the artificial lattice film may be a HCP structure, a FCC structure, or a BCC structure. In the case of a FCC structure, the artificial lattice film is partially orientated to the (111) plane. In the case of a BCC structure, the artificial lattice film is partially orientated to the (110) plane. In the case of a HCP structure, the artificial lattice film is partially orientated to the (001) plane. The orientation can be observed through X-ray diffraction or electron beam diffraction.

The examples of the materials that exhibit perpendicular magnetization also include a FCT ferromagnetic alloy that has a $L1_0$ ordered structure and is formed with at least one element selected from the group consisting of Fe and Co (hereinafter referred to as the element A), and at least one element selected from the group consisting of Pt and Pd (hereinafter referred to as the element B). Typical examples of $L1_0$ ordered structure ferromagnetic alloys include an $L1_0$-FePt alloy, an $L1_0$-FePd alloy, and an $L1_0$-CoPt alloy. It is also possible to employ an $L1_0$-FeCoPtPd alloy that is an alloy formed with the above alloys. To form such a $L1_0$ ordered structure, "x" needs to be in the range of 30 atomic % to 70 atomic %, where the relative proportions of the element A and the element B are expressed as $A_{100-x}B_x$. Part of the element A can be replaced with Ni or Cu. Part of the element B can be replaced with Au, Ag, Ru, Rh, Ir, Os, or a rare earth element (such as Nd, Sm, Gd, or Tb). In this manner, the saturation magnetization Ms and the magnetic crystalline anisotropy energy (uniaxial magnetic anisotropy energy) $K_u$ of the magnetization free layer having perpendicular magnetization can be adjusted and optimized.

The above-described ferromagnetic AB alloy having a $L1_0$ ordered structure is a face-centered tetragonal (FCT) structure. By regulating the structure, large magnetic crystalline anisotropy energy of approximately $1 \times 10^7$ erg/cc can be obtained in the [001] direction. In other words, excellent perpendicular magnetization characteristics can be achieved through preferential orientation toward the (001) plane. The saturation magnetization is approximately in the range of 600 emu/cm$^3$ to 1200 emu/cm$^3$. In a case where an element is added to the alloy by replacing a component with the element A or the element B, the saturation magnetization and the magnetic crystalline anisotropy energy become smaller. On the (001) plane of the ferromagnetic AB alloy having the above described $L1_0$ ordered structure, a BCC structure alloy containing Fe, Cr, V, or the like as a principal component easily grows, preferentially orientated to the (001) plane.

The preferential orientation of a FCT-FePt alloy to the (001) plane can be observed as a (002) peak in the neighborhood of the point where $2\theta$ is 45 to 50 degrees by performing a θ-2θ scan with X-ray diffraction. To improve the perpendicular magnetization characteristics, the half width of the rocking curve of the (002) diffraction peak needs to be 10 degrees or less, and, more preferably, 5 degrees or less.

The existence of a $L1_0$ ordered structure phase and the preferential orientation to the (001) plane can be observed as a (001) diffraction peak in the neighborhood of the point where 2θ is 20 to 25 degrees by performing a θ-2θ scan with X-ray diffraction.

Those diffraction images that are derived from the (001) plane and the (002) plane can be observed through electron beam diffraction or the like.

EXAMPLES

Next, specific stacked structures of TMR elements are described as examples in accordance with the present invention in detail.

Example 1

Figure 5:
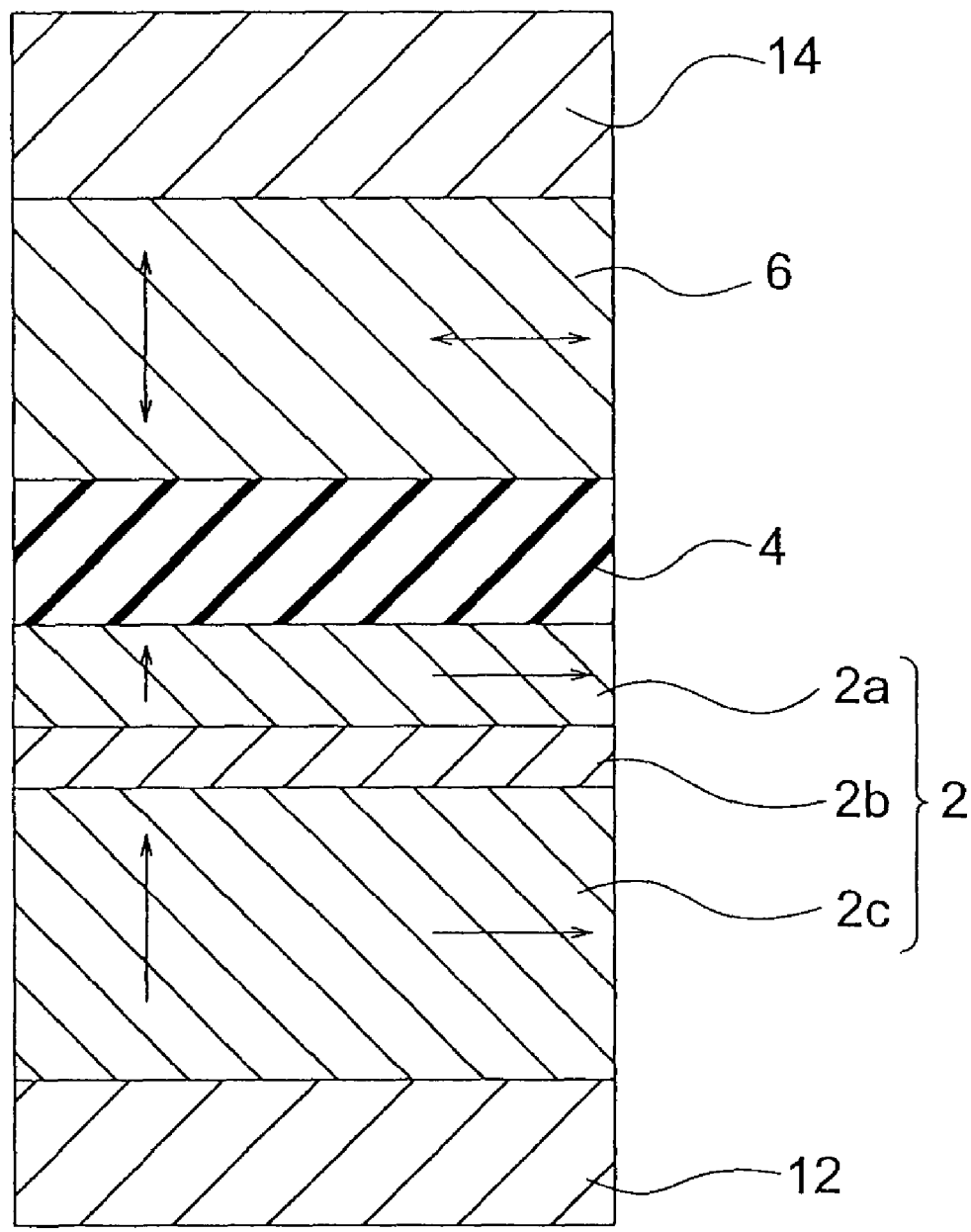
FIG. 5 is a cross-sectional view of a TMR element in accordance with an example 1.

FIG. 5 shows a TMR element of a coercitivity differential type as Example 1 in accordance with the present invention. The TMR element of Example 1 is of a bottom-reference type. More specifically, a magnetization reference layer 2 is formed on a under layer 12, an intermediate layer 4 is formed on the magnetization reference layer 2, a magnetization free layer 6 is formed on the intermediate layer 4, and a cap layer 14 is formed on the magnetization free layer 6. The magnetization reference layer 2 is a stacked structure that includes an assisting magnetic layer 2c formed on the under layer 12, a crystallization promoting layer 2b formed on the assisting magnetic layer 2c, and an interfacial magnetic layer 2a formed on the crystallization promoting layer 2b. In this example, the magnetic reference layer 2 and the magnetization free layer 6 may both have magnetization perpendicular to the film plane, or may both have magnetization parallel to the film plane.

Example 2

Figure 6:
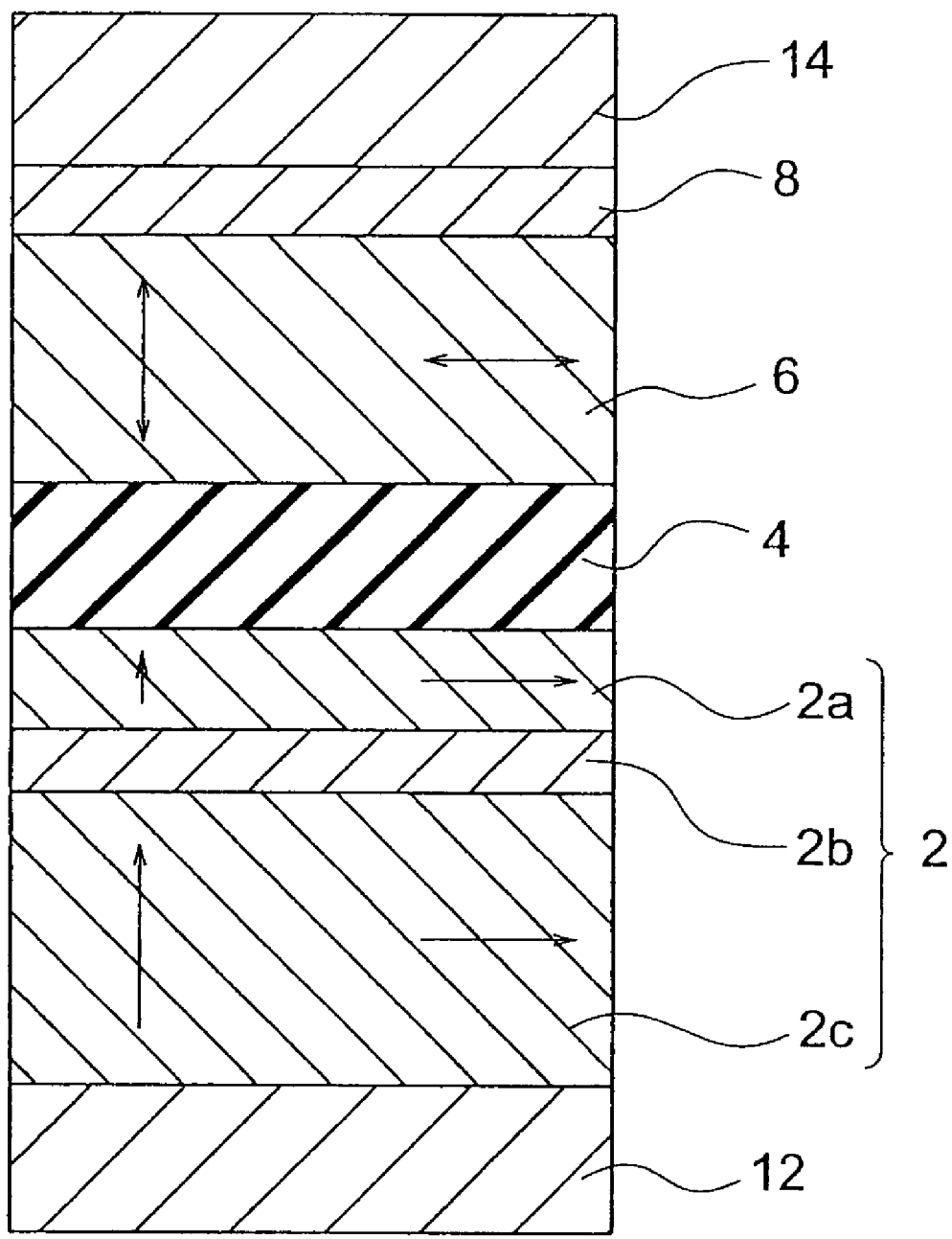
FIG. 6 is a cross-sectional view of a TMR element in accordance with an example 2.

FIG. 6 shows a TMR element of a coercitivity differential type as Example 2 in accordance with the present invention. The TMR element of Example 2 is of a bottom-reference type, and is the same as the TMR element of Example 1 shown in FIG. 5, except that a crystallization promoting layer 8 is provided between the magnetization free layer 6 and the cap layer 14. In this example, the interfacial magnetic layer serving as the magnetization free layer 6 may not be made of a material that is crystallized from an amorphous structure, but may be made of a magnetic material that is crystallized in the first place. In this case, the crystallization promoting layer 8 plays a role of an excess oxygen absorbing layer to adjust the stoichiometric composition of the barrier layer (the intermediate layer) 4. In this example, the magnetic reference layer 2 and the magnetization free layer 6 may both have magnetization perpendicular to the film plane, or may both have magnetization parallel to the film plane.

Example 3

Figure 7:
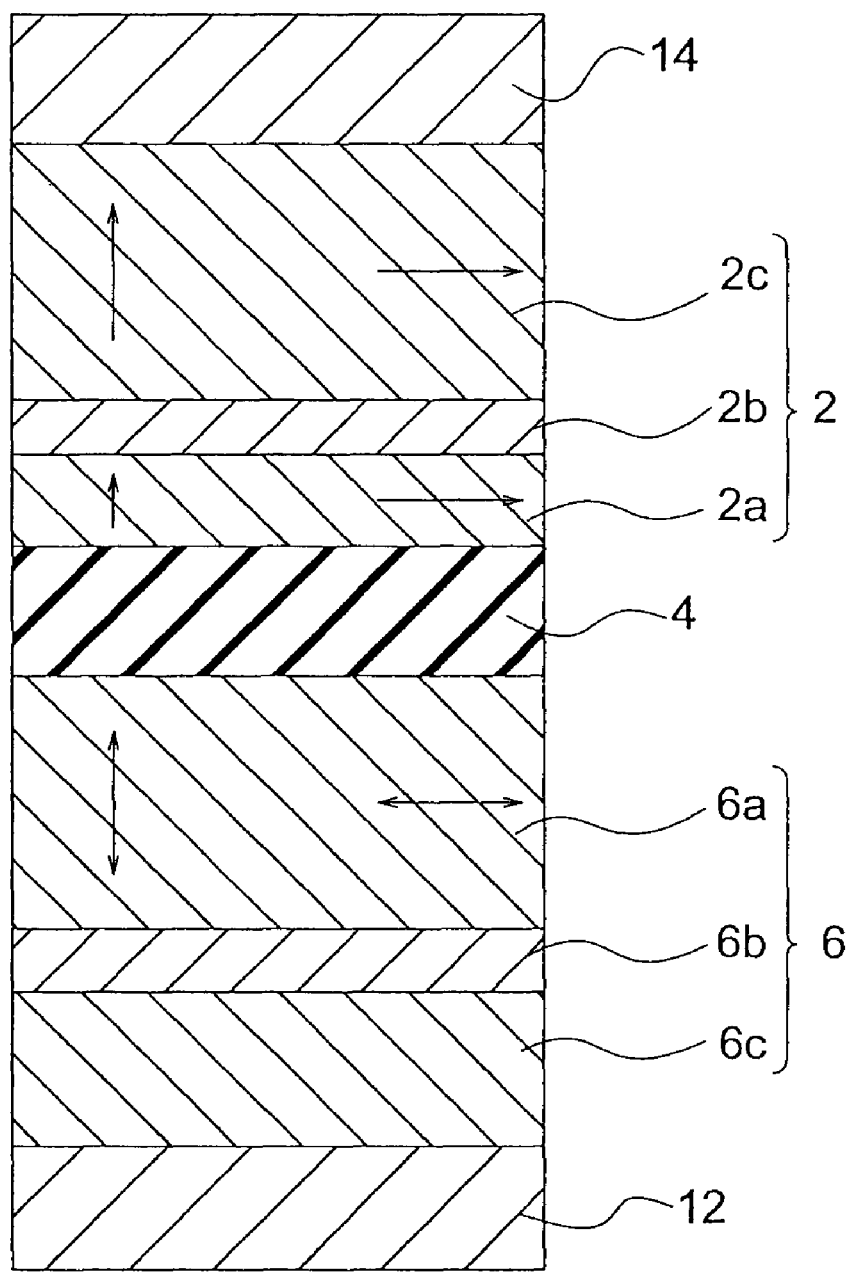
FIG. 7 is a cross-sectional view of a TMR element in accordance with an example 3.

FIG. 7 shows a TMR element of a coercitivity differential type as Example 3 in accordance with the present invention. The TMR element of Example 3 is of a top-reference type. More specifically, a magnetization free layer 6 is formed on a under layer 12, an intermediate layer 4 is formed on the magnetization free layer 6, a magnetization reference layer 2 is formed on the intermediate layer 4, and a cap layer 14 is formed on the magnetization reference layer 2. The magnetization free layer 6 is a stacked structure that includes an assisting magnetic layer 6c formed on the under layer 12, a crystallization promoting layer 6b formed on the assisting magnetic layer 6c, and an interfacial magnetic layer 6a formed on the crystallization promoting layer 6b. The magnetization reference layer 2 is a stacked structure that includes an interfacial magnetic layer 2a formed on the intermediate layer 4, a crystallization promoting layer 2b formed on the interfacial magnetic layer 2a, and an assisting magnetic layer 2c formed on the crystallization promoting layer 2b. In this example, the magnetic reference layer 2 and the magnetization free layer 6 may both have magnetization perpendicular to the film plane, or may both have magnetization parallel to the film plane.

Specific example structures of the respective TMR elements of Examples 1 to 3 are shown below. The numeric values shown in the brackets indicate film thicknesses.

Specific Example Structure of Example 1

Cap layer 14/magnetization free layer 6 made of FePt (3 nm)/intermediate layer (barrier layer) 4 made of MgO (1 nm)/interfacial magnetic layer 2a made of CoFeB (2 nm)/crystallization promoting layer 2b made of Ta (0.2 nm)/assisting magnetic layer 2c made of FePt (10 nm)/under layer 12/thermally oxidized Si substrate (not shown)

Specific Example Structure of Example 2

Cap layer 14/crystallization promoting layer 8 made of Mg (0.5 nm)/magnetization free layer 6 made of FePt (3 nm)/intermediate layer (barrier layer) 4 made of MgO (1 nm)/interfacial magnetic layer 2a made of CoFeB (2 nm)/crystallization promoting layer 2b made of Ta (0.2 nm)/assisting magnetic layer 2c made of FePt (10 nm)/under layer 12/thermally oxidized Si substrate (not shown)

Specific Example Structure of Example 3

Cap layer 14/assisting magnetic layer 2c made of FePt (10 nm)/crystallization promoting layer 2b made of Mg (0.5 nm)/interfacial magnetic layer 2a made of Fe (1.5 nm)/intermediate layer (barrier layer) 4 made of MgO (0.7 nm)/interfacial magnetic layer 6a made of CoFeB (0.5 nm)/crystallization promoting layer 6b made of Ta (0.2 nm)/assisting magnetic layer 6c made of FePt (2 nm)/under layer 12/thermally oxidized Si substrate (not shown)

The above described specific example structures are TMR elements having perpendicular magnetization. In the case of a TMR element that has the perpendicular magnetization shown in each specific example structure of Examples 1 and 2, a FePt film having a $L1_0$ ordered structure is employed as the interfacial magnetic layer 6a of the magnetization free layer 6. A CoFeB alloy is employed as the interfacial magnetic layer 2a of the magnetization reference layer 2, a FePt alloy is employed as the assisting magnetic layer 2c, and a Ta film is employed as the crystallization promoting layer 2b.

In the TMR element having the specific example structure of Example 3, a CoFeB film is employed as the interfacial magnetic layer 6a of the magnetization free layer 6, a FePt film having a $L1_0$ ordered structure is employed as the assisting magnetic layer 6c, and a Ta film is employed as the crystallization promoting layer 6b. A Fe film is employed as the interfacial magnetic layer 2a of the magnetization reference layer 2, a FePt film having a $L1_0$ ordered structure is employed as the assisting magnetic layer 2c, and a Mg film is employed as the crystallization promoting layer 2b.

Here, examples of $L1_0$ alloy layers that can be used in the magnetization free layer include not only FePt alloys but also ferromagnetic alloys each formed with an element X that is at least one element selected from the group consisting of Fe and Co, and an element Y that is at least one element selected from the group consisting of Pt and Pd. Typical examples are a FePt alloy of a $L1_0$ ordered structure, a FePd alloy of a $L1_0$ ordered structure, and a CoPt alloy of a $L1_0$ ordered structure. To form a $L1_0$ ordered structure, the relative proportions of the element X and the element Y should preferably indicate that the relative proportion of the element X is in the range of 40 atomic % to 60 atomic %. Part of a magnetization free layer made of a XY alloy having the above described $L1_0$ ordered structure may be replaced with Ni, Cu, Zn, or the like. In this manner, the saturation magnetization Ms can be made lower. In a case where part of the magnetization free layer is replaced with Cu, Zn, or the like, the ordering temperature can be made lower.

Also, part of a magnetization free layer made of a XY alloy having the above described $L1_0$ ordered structure may be replaced with Cu, Au, Ag, Ru, Rh, Ir, Os, or a rare earth element (Nd, Sm, Gd, Tb, or the like).

The above-described ferromagnetic XY alloy having the $L1_0$ ordered structure is a FCT structure. By regulating the structure, large magnetic crystalline anisotropy energy of approximately $1 \times 10^7$ erg/cm$^3$ can be obtained in the [001] direction. In other words, excellent perpendicular magnetization characteristics can be achieved through preferential orientation toward the (001) plane. The saturation magnetization is approximately in the range of 600 emu/cm$^3$ to 1100 emu/cm$^3$. In a case where one of the above mentioned elements is added, saturation magnetization can be made lower through optimization, while effective magnetic crystalline anisotropy is maintained.

In the TMR elements of Examples 1 and 2 shown in FIGS. 5 and 6, the noble metal such as Pt or Pd might diffuse into the interfacial magnetic layer 2a having an amorphous structure, if the interfacial magnetic layer 2a is formed on the assisting magnetic layer 2c of the magnetization reference layer 2. As a result, crystallization of the interfacial magnetic layer 2a from an amorphous structure phase might be hindered. Therefore, the crystallization promoting layer 2b is inserted between the interfacial magnetic layer film 2a and the assisting magnetic layer 2c, so that the noble metal such as Pt or Pd can be prevented from diffusing into the interfacial magnetic layer 2a.

The crystallization promoting layer 2b serves to prevent diffusion. In view of this, if the magnetization reference layer 2 has the assisting magnetic layer 2c of hard magnetism at the bottom as shown in FIGS. 5 and 6, it is preferable to insert a crystallization promoting layer 2b that is not made of an element that is not solid-soluble in noble metals such as Pt and Pd. Other than Ta, the crystallization promoting layer 2b may be made of Mg, Ca, Sc, Ti, Sr, Y, Zr, Nb, Mo, Ba, La, Hf, W, or the like.

The material CrFeB of the interfacial magnetic layer 2a tends to have in-plane magnetization. Therefore, magnetic exchange coupling being disrupted by the insertion of the crystallization promoting layer 2b is not preferable to maintain the perpendicular magnetization characteristics of the interfacial magnetic layer 2a. In view of this, it is preferable to insert a rare earth element such as Ce, Pr, Nd, Sm, Eu, Tb, Dy, Ho, Er, Tm, Yb, or Lu. This is because magnetism can be generated by the mixing at the time of film formation. Especially, Gd is a ferromagnetic material, even though it is a single element. To maintain the perpendicular magnetization, it is preferable that the film thickness of the above described crystallization promoting layer is 1 nm or smaller. In the case of Gd, the film thickness should preferably be 2 nm or less. However, to maintain the perpendicular magnetization of the interfacial magnetic layer of the magnetization reference layer, the product of the saturation magnetization Ms and the film thickness t should preferably be 4.0 [nm·T (nanometer·tesla)] or less.

Examples 4 and 5

Typical example of stacked structures that are TMR elements of bottom-reference types in which Gd is employed for the crystallization promoting layers are now shown as Examples 4 and 5.

Example 4

Cap layer 14/magnetization free layer 6 made of FePt (3 nm)/intermediate layer (barrier layer) 4 made of MgO (1 nm)/interfacial magnetic layer 2a made of CoFeB (2 nm)/crystallization promoting layer 2b made of Gd (0.5 nm)/assisting magnetic layer 2c made of FePt (10 nm)/under layer 12/thermally oxidized Si substrate In a TMR element of the bottom-reference type such as the TMR elements of Examples 1 and 2, an alloy film formed with a rare earth element and an element X that is at least one element selected from the group consisting of Fe and Co may be employed as the crystallization promoting layer. An alloy film formed with a rare earth element and the element X has perpendicular magnetization. Example 5 is a stacked structure in a TMR element of a typical bottom-reference type.

Example 5

Cap layer 14/magnetization free layer 6 made of FePt (3 nm)/intermediate layer (barrier layer) 4 made of MgO (1 nm)/interfacial magnetic layer 2a made of CoFeB (2 nm)/crystallization promoting layer 2b made of CoFeTb (5 nm)/assisting magnetic layer 2c made of FePt (10 nm)/under layer 12/thermally oxidized Si substrate Although the film thickness of the above CoFeTb film 2b is 5 nm, it may be in the range of 0.1 nm to 10 nm by optimizing the film formation process. Here, the relative proportion of Tb in the CoFeTb film is 50 vol % or less in volume percent. The relative proportion of the rare earth element should preferably be 50 vol % or less. If a larger amount than that is added, the exchange coupling between the interfacial magnetic layer 2a and the assisting magnetic layer 2c becomes weaker, and the perpendicular magnetization might not be maintained.

Example 6

Figure 8:
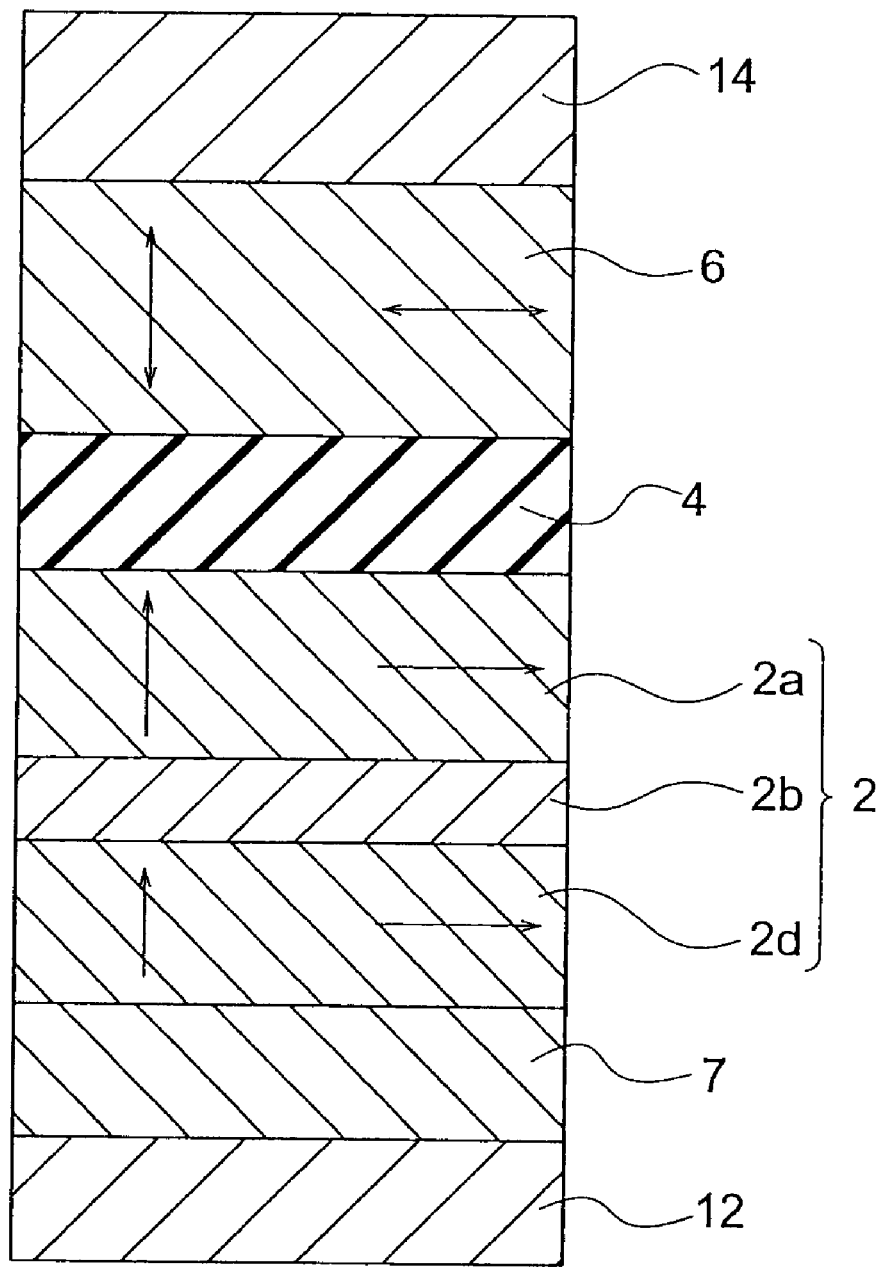
FIG. 8 is a cross-sectional view of a TMR element in accordance with an example 6.

FIG. 8 shows a stacked structure of a TMR element as Example 6, which is a structure of a bottom-reference type in which the magnetization of the magnetization reference layer 2 is fixed by an antiferromagnetic layer 7. The TMR element of this example shown in FIG. 8 is the same as the TMR element of Example 1 shown in FIG. 5, except that the assisting magnetic layer 2c of the magnetization reference layer 2 is replaced with a magnetization pinned film 2d having magnetization fixed by the antiferromagnetic layer 7. The materials used in this example are those mentioned in Examples 1 to 5. The magnetization directions of the magnetization pinned film 2d and the interfacial magnetic layer 2a may be perpendicular to the film plane or may be parallel to the film plane.

Example 7

Figure 9:
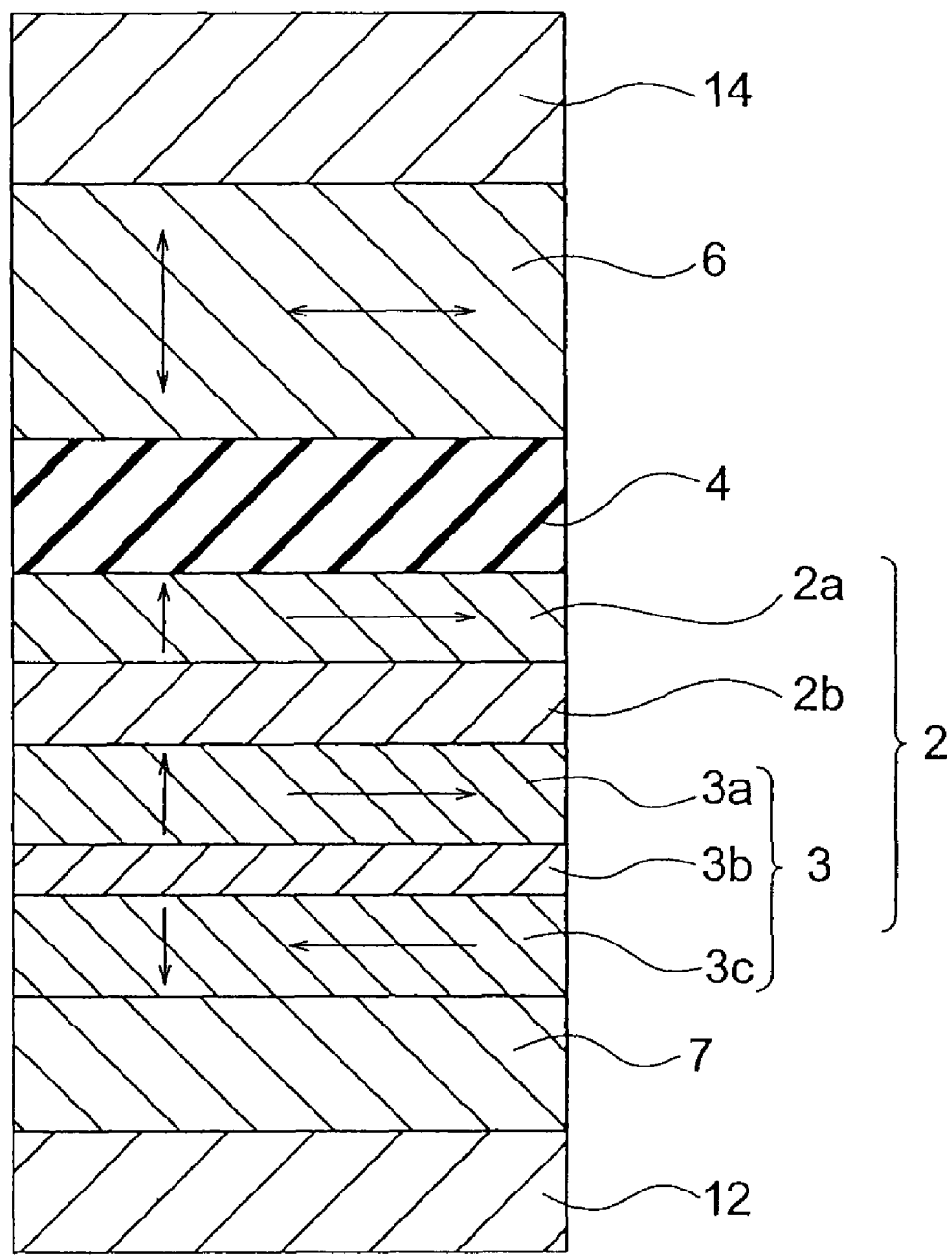
FIG. 9 is a cross-sectional view of a TMR element in accordance with an example 7.

FIG. 9 is a cross-sectional view of a TMR element as Example 7 in accordance with the present invention. The TMR element of this example is the same as the TMR element of Example 6, except that the magnetization pinned film 2d that is a single-layer magnetic film is replaced with a magnetization pinned layer 3 having a synthetic structure. More specifically, the magnetization pinned layer 3 is a stacked structure having a nonmagnetic film 3b provided between a magnetic film (an interfacial magnetic layer) 3a and a magnetic film 3c. The magnetic film 3a and the magnetic film 3c are antiferromagnetically coupled to each other via the nonmagnetic film 3b. The magnetization of the magnetization pinned layer 3 is fixed by the antiferromagnetic layer 7. The magnetization directions of the magnetization pinned layer 3 and the interfacial magnetic layer 2a may be perpendicular to the film plane or may be parallel to the film plane.

In practice, the antiferromagnetic layer 7 may be a FeMn alloy layer, a PtMn alloy layer, an IrMn alloy layer, a NiMn alloy layer, a PdMn alloy layer, a RhMn alloy layer, a PtCr alloy layer, a PtCrMn alloy layer, or the like. The optimum film thickness is in the range of 5 nm to 20 nm.

In the synthetic structure, the nonmagnetic film 3 is inserted between the interfacial magnetic layer 3a and the magnetic film 3c. The nonmagnetic film 3b may be made of Ru, Os, or Ir, and its optimum film thickness is in the range of 0.5 nm to 3 nm. The synthetic structure utilizes interlayer coupling, and a film thickness with which the antiferromagnetic coupling becomes the strongest is used. In the synthetic structure, the magnetization directions of the interfacial magnetic layer 3a and the magnetic film 3c are antiparallel to each other.

In Example 7 shown in FIG. 9, the crystallization promoting layer 2b is inserted to an interfacial magnetic layer, and divides the interfacial magnetic layer into the interfacial magnetic layer 2a and the interfacial magnetic layer 3a. The film thickness of the interfacial magnetic layer 2a that is located near the barrier layer 4 needs to be 1 nm or greater, with the influence of the mixing of the layers above and below the interfacial magnetic layer 2a being taken into consideration. The magnetization directions of the interfacial magnetic layer 2a and the interfacial magnetic layer 3a are parallel to each other.

Typical examples of TMR elements that are used with in-plane magnetization are now described as stacked structures of Examples 8 to 12.

Example 8

This example is a specific example structure of Example 6 shown in FIG. 8, and has the following stacked structure:

Cap layer 14/magnetization free layer 6 made of CoFeB (3 nm)/intermediate layer (barrier layer) 4 made of MgO (1 nm)/interfacial magnetic layer 2a made of CoFeB (3 nm)/crystallization promoting layer 2b made of Ta (0.2 nm)/magnetization pinned film 2d made of CoFe (2.5 nm)/antiferromagnetic layer 7 made of MnPt (10 nm)/under layer 12/thermally oxidized Si substrate

Example 9

This example is a specific example structure of Example 7 shown in FIG. 9, and has the following stacked structure:

Cap layer 14/magnetization free layer 6 made of CoFeB (3 nm)/intermediate layer (barrier layer) 4 made of MgO (1 nm)/interfacial magnetic layer 2a made of CoFeB (1.5 nm)/crystallization promoting layer 2b made of Ta (0.2 nm)/interfacial magnetic layer 3a made of CoFeB (1.5 nm)/nonmagnetic film 3b made of Ru (0.85 nm)/magnetic film 3c made of CoFe (2.5 nm)/antiferromagnetic layer 7 made of PtMn (10 nm)/under layer 12/thermally oxidized Si substrate Typical examples of TMR elements that have perpendicular magnetization are now described as stacked structures of Examples 10 to 12.

Example 10

This example is a specific example structure of Example 6 shown in FIG. 8, and has the following stacked structure:

Cap layer 14/magnetization free layer 6 made of FePt (3 nm)/intermediate layer (barrier layer) 4 made of MgO (1 nm)/interfacial magnetic layer 2a made of CoFeB (2 nm)/crystallization promoting layer 2b made of Ta (0.2 nm)/magnetization pinned film 2d made of FePt (10 nm)/antiferromagnetic layer 7 made of FeMn (10 nm)/under layer 12/thermally oxidized Si substrate

Example 11

This example is another specific example structure of Example 6 shown in FIG. 8, and has the following stacked structure in which a 5-nm thick CoFeTb film is used as the crystallization promoting layer 2b:

Cap layer 14/magnetization free layer 6 made of FePt (3 nm)/intermediate layer (barrier layer) 4 made of MgO (1 nm)/interfacial magnetic layer 2a made of CoFeB (2 nm)/crystallization promoting layer 2b made of CoFeTb (5 nm)/magnetization pinned film 2d made of FePt (10 nm)/antiferromagnetic layer 7 made of FeMn (10 nm)/under layer 12/thermally oxidized Si substrate In this example, the magnetization directions of the CoFeB layer of the interfacial magnetic layer 2a and the FePt layer of the magnetization pinned film 2d can be made antiparallel to each other by adjusting the CoFeTb composition. If the relative proportion of the rare earth element Tb exceeds the compensation point, the magnetization directions of the interfacial magnetic layer 2a and the magnetization pinned film 2d become antiparallel to each other.

Example 12

This example is the same as Example 6 shown in FIG. 8, except that the interfacial magnetic layer 2a is replaced with a synthetic structure consisting of a first magnetic film, a nonmagnetic film, and a second magnetic film. The structure of this example is as follows:

Cap layer 14/magnetization free layer 6 made of FePt (3 nm)/intermediate layer (barrier layer) 4 made of MgO (1 nm)/first magnetic film made of CoFeB (1 nm)/nonmagnetic film made of Ru (0.8 nm)/second magnetic film made of CoFeB (1 nm)/crystallization promoting layer 2b made of Ta (0.2 nm)/magnetization pinned film 2d made of FePt (10 nm)/antiferromagnetic layer 7 made of FeMn (10 nm)/under layer 12/thermally oxidized Si substrate Next, TMR elements of Example 13 and Comparative Example formed by a sputtering technique are described. For each of those TMR elements, the area resistance RA and the TMR ratio were measured by an in-plane energizing technique.

Example 13

The TMR element of this example is a specific example of the TMR element of Example 1 shown in FIG. 5, and has the following stacked structure:

Cap layer 14/magnetization free layer 6 made of FePt (3 nm)/intermediate layer (barrier layer) 4 made of MgO (2 nm)/interfacial magnetic layer 2a made of CoFeB (2 nm)/crystallization promoting layer 2b made of Ta (0.2 nm)/assisting magnetic layer 2c made of FePt (10 nm)/under layer 12/thermally oxidized Si substrate Comparative Example This comparative example is the same as Example 13, except that the crystallization promoting layer 2b is not formed. The structure of this comparative example is as follows:

Cap layer 14/magnetization free layer 6 made of FePt (3 nm)/intermediate layer (barrier layer) 4 made of MgO (2 nm)/interfacial magnetic layer 2a made of CoFeB (2 nm)/assisting magnetic layer 2c made of FePt (10 nm)/under layer 12/thermally oxidized Si substrate The results of the measurement show that the RA in Comparative Example is approximately 20 k$\Omega\mu m^2$, and the RA in Example 13 is approximately 10 k$\Omega\mu m^2$. Meanwhile, the TMR ratio does not become lower, and is maintained at a constant value.

A TMR element of Example 14 formed by the same sputtering technique as above is now described.

Example 14

The TMR element of this example is the same as the TMR element of Example 13, except that the 0.2-nm thick crystallization promoting layer 2b made of Ta is replaced with a 10-nm thick CoFeTb film. This TMR element has the following stacked structure:

Cap layer 14/FePt (3 nm)/intermediate layer (barrier layer) 4 made of MgO (2 nm)/interfacial magnetic layer 2a made of CoFeB (2 nm)/crystallization promoting layer 2b made of CoFeTb (10 nm)/assisting magnetic layer 2c made of FePt (10 nm)/under layer 12/thermally oxidized Si substrate Through transmission electron microscopic (TEM) observation, the interfacial magnetic layer 2a of Example 14 was observed. As a result of cross-sectional TEM observation, crystallization in the CoFeB film of the interfacial magnetic layer 2a was confirmed in Example 14. In Comparative Example, however, the entire CoFeB film as the interfacial magnetic layer 2a was substantially an amorphous structure.

Further, the RA was measured by the in-plane energizing technique. The results showed that the RA in Comparative Example was approximately 20 k$\Omega\mu m^{-2}$, and the RA in Example 14 having the CoFeTb film inserted as the crystallization promoting layer 2b was lowered to 1 k$\Omega\mu m^{-2}$.

As described above, in accordance with this embodiment, a low-resistance TMR element can be obtained, and a magnetization reversal of the magnetization free layer can be caused with a low current. Thus, a low-resistance magnetoresistive element of a spin-injection write type can be provided.

Second Embodiment

Next, a MRAM of a spin injection write type in accordance with a second embodiment of the present invention is described.

Figure 10:
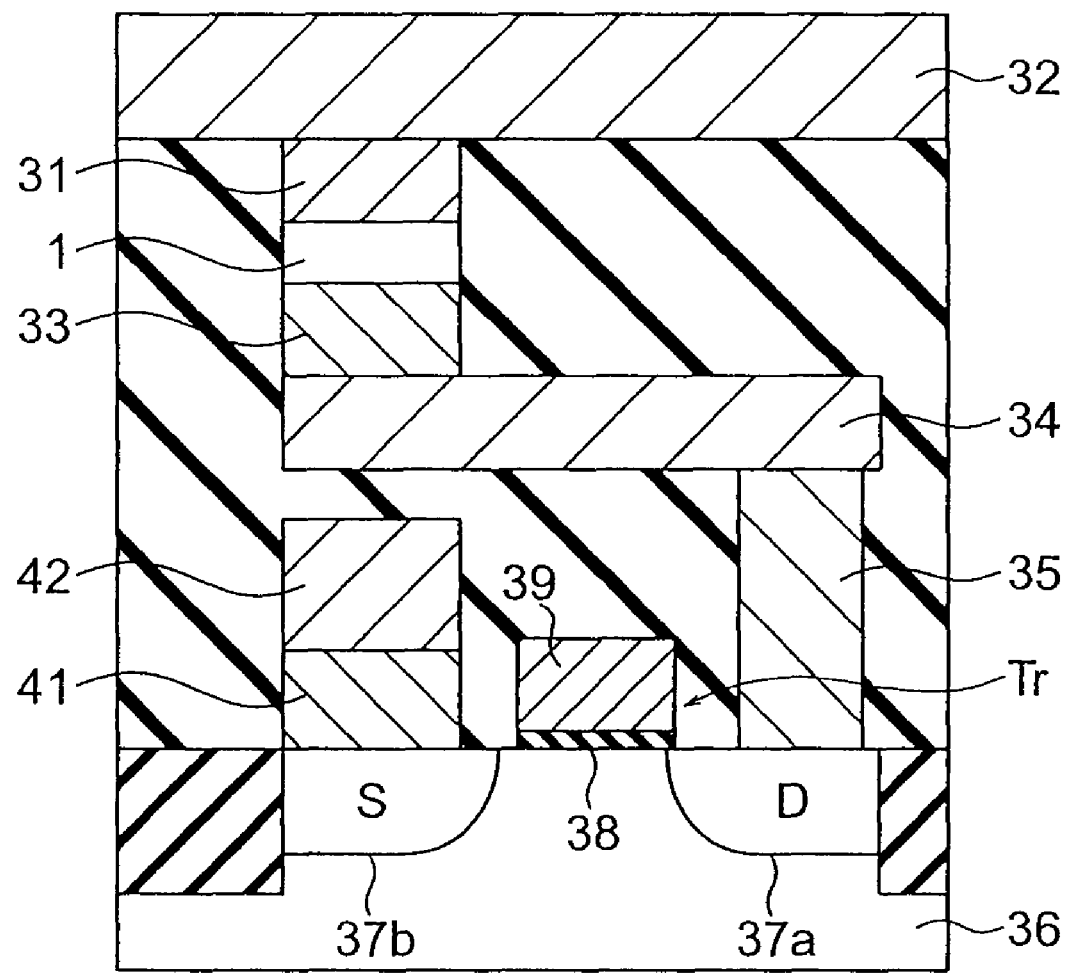
FIG. 10 is a cross-sectional view of a memory cell in a MRAM in accordance with a second embodiment.

The MRAM of this embodiment includes memory cells. FIG. 10 is a cross-sectional view of one of the memory cells of the MRAM of this embodiment. As shown in FIG. 10, the upper face of an MR element 1 is connected to a bit line 32 via an upper electrode 31. The lower face of the MR element 1 is connected to a drain region 37a of the source and drain regions on the surface of a semiconductor substrate 36 via a lower electrode 33, an extension electrode 34, and a plug 35. The drain region 37a, a source region 37b, a gate insulating film 38 formed on the substrate 36, and a gate electrode 39 formed on the gate insulating film 38 constitute a selective transistor Tr. The selective transistor Tr and the MR element 1 form the one memory cell of the MRAM. The source region 37b is connected to another bit line 42 via a plug 41. Alternatively, the plug 35 may be provided under the lower electrode 33 without the extension electrode 34, and the lower electrode 33 may be connected directly to the plug 35. The bit lines 32 and 42, the electrodes 31 and 33, the extension electrode 34, and the plugs 35 and 41 are made of W, Al, AlCu, Cu, and the likes.

Figure 11:
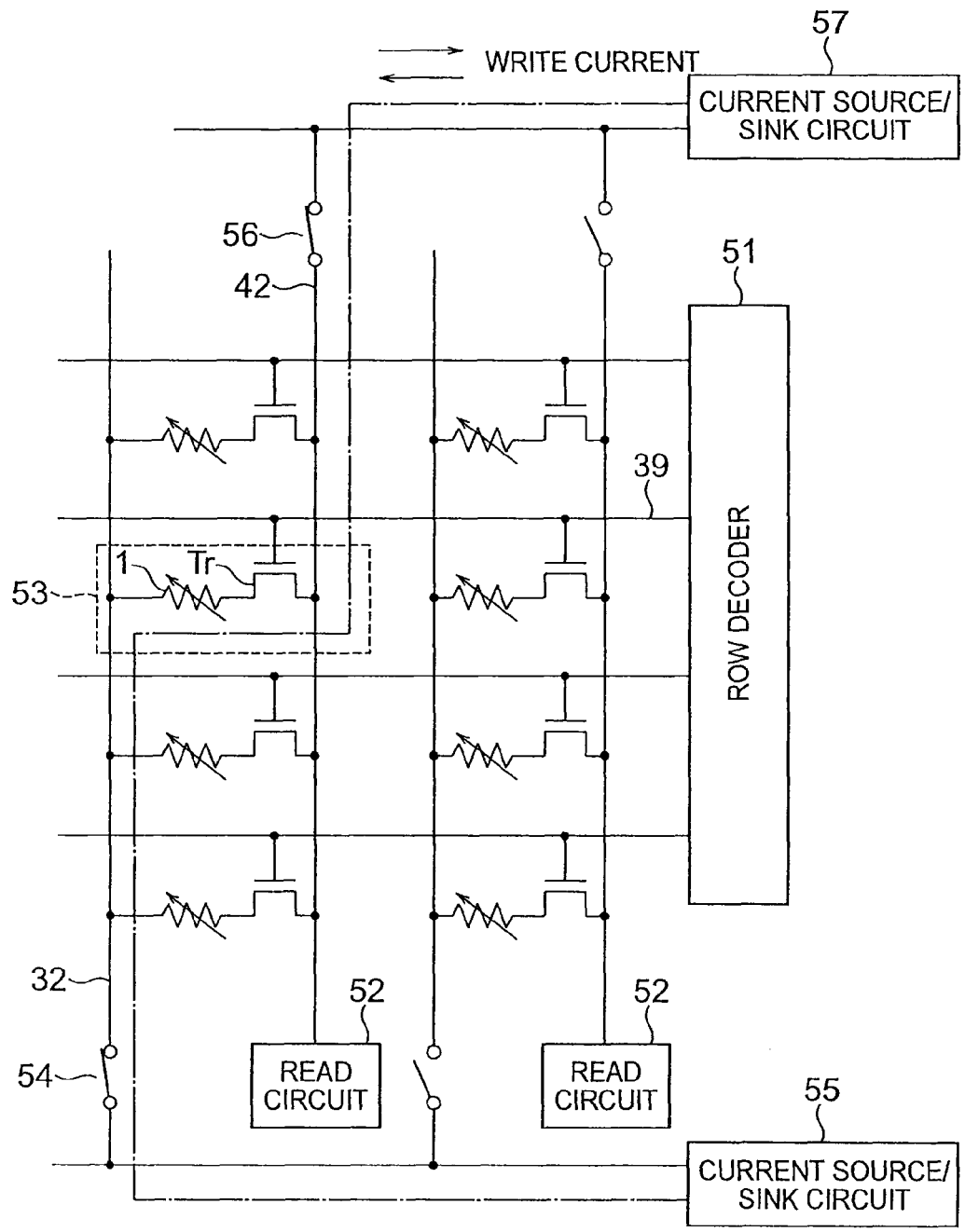
FIG. 11 is a circuit diagram for showing the principle components of the MRAM of the second embodiment.

In the MRAM of this embodiment, memory cells each having the same structure as the memory cell shown in FIG. 10 are arranged in a matrix form, so as to form the memory cell array of the MRAM. FIG. 11 is a circuit diagram showing the principal components of the MRAM of this embodiment.

As shown in FIG. 11, memory cells 53 that are formed with MR elements 1 and selective transistors Tr are arranged in a matrix form. One end of each of the memory cells 53 arranged in the same column is connected to the same bit line 32, and the other end is connected to the same bit line 42. The gate electrodes (word lines) 39 of the memory cells 53 arranged in the same row are connected to one another, and are also connected to a row decoder 51.

The bit line 32 is connected to a current source/sink circuit 55 via a switch circuit 54 such as a transistor. The bit line 42 is connected to a current source/sink circuit 57 via a switch circuit 56 such as a transistor. The current source/sink circuits 55 and 57 supply write current (inversion current) to the connected bit lines 32 and 42, and remove the write current from the connected bit lines 32 and 42.

The bit line 42 is also connected to a read circuit 52. The read circuit 52 may be connected to the bit line 32. The read circuit 52 includes a read current circuit, a sense amplifier, and the likes.

At the time of writing, the switch circuits 54 and 56 connected to the memory cell on which writing is to be performed, and the selective transistor Tr are turned on, so as to form a current path that runs through the subject memory cell. One of the current source/sink circuits 55 and 57 functions as a current source, and the other one functions as a current sink, in accordance with the information to be written. As a result, the write current flows in the direction determined by the information to be written.

As for the write speed, it is possible to perform spin-injection writing with a current having a pulse width of several nanoseconds to several microseconds.

At the time of reading, a read current of such a small size as not to cause a magnetization reversal is supplied to the subject MR element 1 by a read current circuit in the same manner as in the case of writing. The read circuit 52 compares the current value or the voltage value determined by the resistance value in accordance with the magnetization state of the MR element 1, with a reference value. In this manner, the read circuit 52 decides the resistive state.

At the time of reading, the current pulse width should preferably be smaller than the current pulse width observed in a writing operation. Accordingly, write errors with the current at the time of reading can be reduced. This is based on the fact that the absolute value of the write current is larger when the pulse width of the write current is smaller.

As described so far, in accordance with each embodiment of the present invention, low-resistance TMR elements are used as memory elements. Accordingly, the magnetization free layer can be caused to have a magnetization reversal with a low current. Thus, a low-resistance magnetoresistive random access memory of a spin-injection write type can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A magnetoresistive element comprising:
a magnetization reference layer having magnetization substantially perpendicular to a film plane, a direction of the magnetization being invariable;
a magnetization free layer having magnetization substantially perpendicular to the film plane, a direction of the magnetization being variable; and
a barrier layer provided between the magnetization reference layer and the magnetization free layer, the barrier layer having a NaCl structure,
at least one of the magnetization reference layer and the magnetization free layer including:
a first film formed in contact with the barrier layer, and comprising a first magnetic material having a BCC structure, the first magnetic material including at least one element selected from the group consisting of Fe, Co and Ni, at 50 atomic % or higher;
a second film formed in contact with the first film on the opposite side from the barrier layer, and including at least one element selected from the group consisting of Ta, W, Mo, Nb, Ti, Hf and Zr; and
a third film formed on the opposite side of the second film from the first film, the third film comprising a second magnetic material and being an alloy or a stacked structure that contains at least one element selected from the group consisting of Fe, Co and Ni, and at least one element selected from the group consisting of Ru, Rh, Pd, Ag, Os, Ir, Pt and Au, and
the magnetization direction of the magnetization free layer being variable by flowing a current between the magnetization reference layer and the magnetization free layer via the barrier layer.

2. The element according to claim 1, wherein the second film has a film thickness of 1 nm or less.

3. The element according to claim 1, wherein the first film has a film thickness within a range of 0.1 nm to 5 nm.

4. A magnetoresistive element comprising:
a magnetization reference layer having magnetization substantially perpendicular to a film plane, a direction of the magnetization being invariable;
a magnetization free layer having magnetization substantially perpendicular to the film plane, a direction of the magnetization being variable; and
a barrier layer provided between the magnetization reference layer and the magnetization free layer, the barrier layer having a NaCl structure,
at least one of the magnetization reference layer and the magnetization free layer including:
a first film formed in contact with the barrier layer, and comprising a first magnetic material having a BCC structure, the first magnetic material including at least one element selected from the group consisting of Fe, Co and Ni, at 50 atomic % or higher;
a second film formed in contact with the first film on the opposite side from the barrier layer, and including at least one element selected from the group consisting of Ce, Pr, Nd, Sm, Eu, Gd, Tb, Dy, Ho, Er, Tm, Yb and Lu; and
a third film formed on the opposite side of the second film from the first film, the third film comprising a second magnetic material and being an alloy or a stacked structure that contains at least one element selected from the group consisting of Fe, Co and Ni, and at least one element selected from the group consisting of Ru, Rh, Pd, Ag, Os, Ir, Pt and Au, and
the magnetization direction of the magnetization free layer being variable by flowing a current between the magnetization reference layer and the magnetization free layer via the barrier layer.

5. The element according to claim 4, wherein
the element included in the second film is Gd, and
the second film has a film thickness within a range of 0.1 nm to 2 nm.

6. The element according to claim 4, wherein
the element included in the second film is at least one element selected from the group consisting of Ce, Pr, Nd, Sm, Eu, Tb, Dy, Ho, Er, Tm, Yb and Lu, and
the second film has a film thickness within a range of 0.1 nm to 10 nm.

7. The element according to claim 4, wherein the first film has a film thickness within a range of 0.1 nm to 5 nm.

8. A magnetoresistive element comprising:
a magnetization reference layer having magnetization substantially perpendicular to a film plane, a direction of the magnetization being invariable;
a magnetization free layer having magnetization substantially perpendicular to the film plane, a direction of the magnetization being variable; and
a barrier layer provided between the magnetization reference layer and the magnetization free layer, the barrier layer having a NaCl structure,
at least one of the magnetization reference layer and the magnetization free layer including:
a first film formed in contact with the barrier layer, and comprising a first magnetic material having a BCC structure, the first magnetic material including at least one element selected from the group consisting of Fe, Co and Ni, at 50 atomic % or higher;
a second film formed in contact with the first film on the opposite side from the barrier layer, and including at least one element selected from the group consisting of Si, Ge and Ga; and
a third film formed on the opposite side of the second film from the first film, the third film comprising a second magnetic material and being an alloy or a stacked structure that contains at least one element selected from the group consisting of Fe, Co and Ni, and at least one element selected from the group consisting of Ru, Rh, Pd, Ag, Os, Ir, Pt and Au, and
the magnetization direction of the magnetization free layer being variable by flowing a current between the magnetization reference layer and the magnetization free layer via the barrier layer.

9. The element according to claim 8, wherein the first film has a film thickness within a range of 0.1 nm to 5 nm.

10. A magnetoresistive element comprising:
a magnetization reference layer having magnetization substantially perpendicular to a film plane, a direction of the magnetization being invariable;

a magnetization free layer having magnetization substantially perpendicular to the film plane, a direction of the magnetization being variable; and a barrier layer provided between the magnetization reference layer and the magnetization free layer, the barrier layer having a NaC1 structure, at least one of the magnetization reference layer and the magnetization free layer including:

a first film formed in contact with the barrier layer, and comprising a first magnetic material having a BCC structure, the first magnetic material including at least one element selected from the group consisting of Fe, Co and Ni, at 50 atomic % or higher;

a second film formed in contact with the first film on the opposite side from the barrier layer, and including at least one element selected from the group consisting of Ta, W, Mo, Nb, Ti, Hf and Zr; and a third film formed on the opposite side of the second film from the first film, the third film comprising a second magnetic material and being an alloy or a stacked structure that contains at least one element selected from the group consisting of Fe, Co and Ni, and at least one element selected from the group consisting of Ce, Pr, Nd, Sm, Eu, Gd, Tb, Dy, Ho, Er, Tm, Yb and Lu, and the magnetization direction of the magnetization free layer being variable by flowing a current between the magnetization reference layer and the magnetization live layer via the barrier layer.

11. The element according to claim 10, wherein the second film has a film thickness of 1 nm or less.

12. The element according to claim 10, wherein a concentration of the element included in the third film and selected from the group consisting of Ce, Pr, Nd, Sm, Eu, Tb, Dy, Ho, Er, Tm, Yb and Lu is in the range of 25 atomic % to 50 atomic %.

13. The element according to claim 10, wherein the first film has a film thickness within a range of 0.1 nm to 5 nm.

14. A magnetoresistive element comprising:

a magnetization reference layer having magnetization substantially perpendicular to a film plane, a direction of the magnetization being invariable;

a magnetization free layer having magnetization substantially perpendicular to the film plane, a direction of the magnetization being variable; and a barrier layer provided between the magnetization reference layer and the magnetization free layer, the barrier layer having a NaCl structure, at least one of the magnetization reference layer and the magnetization free layer including:

a first film formed in contact with the barrier layer, and comprising a first magnetic material having a BCC structure, the first magnetic material including at least one element selected from the group consisting of Fe, Co and Ni, at 50 atomic % or higher;

a second film formed in contact with the first film on the opposite side from the barrier layer, and including at least one element selected from the group consisting of Ce, Pr, Nd, Sm, Eu, Gd, Tb, Dy, Ho, Er, Tm, Yb and Lu; and a third film formed on the opposite side of the second film from the first film, the third film comprising a second magnetic material and being an alloy or a stacked structure that contains at least one element selected from the group consisting of Fe, Co and Ni, and at least one element selected from the group consisting of Ce, Pr, Nd, Sm, Eu, Gd, Tb, Dy, Ho, Er, Tm, Yb and Lu, and the magnetization direction of the magnetization free layer being variable by flowing a current between the magnetization reference layer and the magnetization free layer via the barrier layer.

15. The element according to claim 14, wherein
the element included in the second film is Gd, and
the second film has a film thickness within a range of 0.1 nm to 2 nm.

16. The element according to claim 14, wherein
the element included in the second film is at least one element selected from the group consisting of Ce, Pr, Nd, Sm, Eu, Tb, Dy, Ho, Er, Tm, Yb and Lu, and
the second film has a film thickness within a range of 0.1 nm to 10 nm.

17. The element according to claim 14, wherein a concentration of the element included in the third film and selected from the group consisting of Ce, Pr, Nd, Sm, Eu, Gd, Tb, Dy, Ho, Er, Tm, Yb and Lu is in the range of 25 atomic % to 50 atomic %.

18. The element according to claim 14, wherein the first film has a film thickness within a range of 0.1 nm to 5 nm.

19. A magnetoresistive element comprising:

a magnetization reference layer having magnetization substantially perpendicular to a film plane, a direction of the magnetization being invariable;

a magnetization free layer having magnetization substantially perpendicular to the film plane, a direction of the magnetization being variable; and a barrier layer provided between the magnetization reference layer and the magnetization free layer, the barrier layer having a NaCl structure, at least one of the magnetization reference layer and the magnetization free layer including:

a first film formed in contact with the barrier layer, and comprising a first magnetic material having a BCC structure, the first magnetic material including at least one element selected from the group consisting of Fe, Co and Ni, at 50 atomic % or higher;

a second film formed in contact with the first film on the opposite side from the barrier layer, and including at least one element selected from the group consisting of Si, Ge and Ga; and a third film formed on the opposite side of the second film from the first film, the third film comprising a second magnetic material and being an alloy or a stacked structure that contains at least one element selected from the group consisting of Fe, Co and Ni, and at least one element selected from the group consisting of Ce, Pr, Nd, Sm, Eu, Gd, Tb, Dy, Ho, Er, Tm, Yb and Lu, and the magnetization direction of the magnetization free layer being variable by flowing a current between the magnetization reference layer and the magnetization free layer via the barrier layer.

20. The element according to claim 19, wherein a concentration of the element included in the third film and selected from the group consisting of Ce, Pr, Nd, Sm, Eu, Gd, Tb, Dy, Ho, Er, Tm, Yb and Lu is in the range of 25 atomic % to 50 atomic %.

21. The element according to claim 19, wherein the first film has a film thickness within a range of 0.1 nm to 5 nm.

22. A magnetoresistive random access memory, comprising:
the magnetoresistive element according to claim 1 as a memory cell.

23. A magnetoresistive random access memory, comprising:

a memory cell that includes the magnetoresistive element according to claim 1 and a transistor having one end series-connected to one end of the magnetoresistive element;

a first write current circuit connected to an other end of the magnetoresistive element; and a second write current circuit connected to the other end of the transistor, and, in cooperation with the first write current circuit, flowing the current between the magnetization reference layer and the magnetization free layer via the barrier layer.

24. A magnetoresistive random access memory, comprising:

the magnetoresistive element according to claim 4 as a memory cell.

25. A magnetoresistive random access memory, comprising:

a memory cell that includes the magnetoresistive element according to claim 4 and a transistor having one end series-connected to one end of the magnetoresistive element;

a first write current circuit connected to an other end of the magnetoresistive element; and a second write current circuit connected to the other end of the transistor, and, in cooperation with the first write current circuit, flowing the current between the magnetization reference layer and the magnetization free layer via the barrier layer.

26. A magnetoresistive random access memory, comprising:

the magnetoresistive element according to claim 8 as a memory cell.

27. A magnetoresistive random access memory, comprising:

a memory cell that includes the magnetoresistive element according to claim 8 and a transistor having one end series-connected to one end of the magnetoresistive element;

a first write current circuit connected to an other end of the magnetoresistive element; and a second write current circuit connected to the other end of the transistor, and, in cooperation with the first write current circuit, flowing the current between the magnetization reference layer and the magnetization free layer via the barrier layer.

28. A magnetoresistive random access memory, comprising:

the magnetoresistive element according to claim 10 as a memory cell.

29. A magnetoresistive random access memory, comprising:

a memory cell that includes the magnetoresistive element according to claim 10 and a transistor having one end series-connected to one end of the magnetoresistive element;

a first write current circuit connected to an other end of the magnetoresistive element; and a second write current circuit connected to the other end of the transistor, and, in cooperation with the first write current circuit, flowing the current between the magnetization reference layer and the magnetization free layer via the barrier layer.

30. A magnetoresistive random access memory, comprising:

the magnetoresistive element according to claim 14 as a memory cell.

31. A magnetoresistive random access memory, comprising:

a memory cell that includes the magnetoresistive element according to claim 14 and a transistor having one end series-connected to one end of the magnetoresistive element;

a first write current circuit connected to an other end of the magnetoresistive element; and a second write current circuit connected to the other end of the transistor, and, in cooperation with the first write current circuit, flowing the current between the magnetization reference layer and the magnetization free layer via the barrier layer.

32. A magnetoresistive random access memory, comprising:

the magnetoresistive element according to claim 19 as a memory cell.

33. A magnetoresistive random access memory, comprising:

a memory cell that includes the magnetoresistive element according to claim 19, and a transistor having one end series-connected to one end of the magnetoresistive element;

a first write current circuit connected to an other end of the magnetoresistive element; and a second write current circuit connected to the other end of the transistor, and, in cooperation with the first write current circuit, flowing the current between the magnetization reference layer and the magnetization free layer via the barrier layer.

\* \* \* \* \*